United States Patent [19]
Tatosian et al.

[11] Patent Number: 5,490,113
[45] Date of Patent: Feb. 6, 1996

[54] MEMORY STREAM BUFFER

[75] Inventors: David A. Tatosian, Stow; Paul M. Goodwin, Littleton; Kurt M. Thaller, Acton; Donald W. Smelser, Bolton, all of Mass.

[73] Assignee: Digital Equipment Corporation, Maynard, Mass.

[21] Appl. No.: 259,847

[22] Filed: Jun. 15, 1994

[51] Int. Cl.⁶ .................................................. G11C 7/00
[52] U.S. Cl. .............. 365/189.05; 365/221; 365/230.02; 365/230.08; 395/427
[58] Field of Search ..................... 365/189.05, 221, 365/230.02, 230.08, 233; 395/425

[56] References Cited

U.S. PATENT DOCUMENTS

| | | | |
|---|---|---|---|
| 4,292,674 | 9/1981 | Scheuneman | 364/200 |
| 4,621,320 | 11/1986 | Holste | 364/200 |
| 4,761,731 | 8/1988 | Webb | 364/200 |
| 5,003,471 | 3/1991 | Gibson | 364/200 |
| 5,146,578 | 9/1992 | Zangenehpour | 395/425 |
| 5,159,676 | 10/1992 | Wicklund | 395/425 |
| 5,251,181 | 10/1993 | Toda | 365/230.08 |
| 5,257,235 | 10/1993 | Miyamoto | 365/189.05 X |
| 5,261,066 | 11/1993 | Jouppi | 395/425 |
| 5,289,584 | 2/1994 | Thome | 395/325 |
| 5,295,117 | 3/1994 | Okada | 365/189.05 |
| 5,301,278 | 4/1994 | Bowater | 395/275 |
| 5,305,283 | 4/1994 | Shimokura et al. | 365/230.08 |

*Primary Examiner*—David C. Nelms
*Assistant Examiner*—Huan Hoang
*Attorney, Agent, or Firm*—James F. Thompson; Ronald C. Hudgens

[57] ABSTRACT

A memory system has a stream buffer with several performance-enhancing features. Two distinct sets of latches receive data from the memory array. One set feeds the stream buffer, while the other holds memory data that is destined for a system bus. The dual-latch configuration allows stream buffer fills to proceed even if system bus stalls prevent the memory data latch from being timely emptied. The memory controller prefetches a number of data blocks depending on the interleave factor of the memory system, as well as in response to control information from the CPU that can override the interleave-based number in some system configurations. The stream buffer employs a history buffer containing the addresses of recently-read memory locations in order to declare a new stream. The addresses of memory reads are normally entered into the history buffer on a round-robin basis. However, the addresses of those reads that hit in the stream buffer are not entered, thus improving the overall efficiency of the stream buffer. Also, the memory refresh controller treats stream buffer hits as memory refresh opportunities. Finally, a block of control/status registers within the memory controller is accessible in two distinct address ranges, so that the memory controller may easily be used in different hardware configurations.

8 Claims, 11 Drawing Sheets

MEMORY STREAM BUFFER

FIELD OF THE INVENTION

The invention is related to the field of computer systems, and more particularly to computer memory systems.

BACKGROUND OF THE INVENTION

In computer systems, memory access time is an important factor affecting overall performance. Memory access time is affected by, among other things, the inherent access time of the array of memory devices used in the memory system, and also by queuing delays, i.e., delays that result when a memory request is forced to wait for access to the memory array. Both of these types of delay tend to increase as the size and complexity of the memory system increases, with a concomitant decrease in performance.

It has been known to employ buffers or caches in order to reduce delays associated with memory requests. Such devices are placed between the memory system and the requestor, which may be for example a central processing unit (CPU). These buffer devices tend to be significantly faster than the memory array, and therefore they reduce the delay experienced by memory requests that they service. Most higher-performance computer systems therefore employ both a large DRAM memory array and a smaller cache or buffer situated between the memory array and one or more requestors.

While such an intermediate buffer can therefore contribute to greater performance, it also introduces more complexity into the data path of the computer system. This is because the memory array must be able to supply data to both the requestor and the buffer, and the requestor must generally be able to accept data from either the memory array or the buffer. If the data path is not carefully designed, it may contain bottlenecks that unnecessarily limit memory system performance. For example, if there were only one data port for data into and out of the buffer, it would be impossible to fill the buffer from the memory at the same time that a requestor is obtaining data from the buffer. If the rest of the system were capable of such concurrent operation, the data path would be a bottleneck acting to limit performance. It is generally desirable to eliminate such bottlenecks in the interest of achieving maximum memory system performance.

While data path concerns are common to systems employing any type of intermediate buffer as described above, other concerns arise when the buffer is of a particular type. One special type of intermediate buffer is known as a stream buffer. A stream buffer is designed to improve the average access time of a stream of sequential memory accesses. It does this in part by prefetching data from the memory array that sequentially follows requested data, storing the prefetched data into the stream buffer, and providing the prefetched data to the requestor from the stream buffer it is subsequently requested. The buffer also operates in first-in-first-out (FIFO) fashion, so that newly-prefetched data can be stored in the stream buffer as soon as previously-prefetched data is used.

One general concern with stream buffers is achieving the optimum amount of prefetching. If insufficient data is prefetched during a string of sequential memory requests, the stream buffer cannot service as many requests as it otherwise could, and so its beneficial impact on memory access time is diminished or lost. Conversely, if too much prefetching is performed, the likelihood that the prefetched data will be used diminishes. In such a case, the memory bandwidth devoted to the excess prefetching would be better spent on servicing requests for data that is actually needed.

To achieve optimum prefetching, it has been known to use a history buffer to improve the chances that prefetched data will actually be used. At any time, the history buffer retains the addresses of one or more of the most recent memory requests. When a new request occurs, its address is compared with the contents of the history buffer to determine whether a pattern of sequential accesses is occurring. If the address is sequential to any of the addresses in the history buffer, the stream buffer begins prefetching starting at the next sequential address. This checking increases the likelihood that prefetched data will later be requested as part of the same stream of sequential memory accesses.

Another technique that has been used to optimize prefetching finds application in memory systems that are interleaved. In interleaved memory systems, each memory array contains only a portion of the entire memory contents, and that portion is interleaved with the portions contained by all the other memory arrays in the memory system. For example, each array in a 4-way interleaved memory system holds one-fourth of the entire memory contents, and services requests only for every fourth data element in the memory. In such an interleaved system, a memory access to one array can often be hidden underneath sequential accesses to the other arrays. As a result, an interleaved memory system generally does not benefit from the same degree of prefetching as does a non-interleaved system. Accordingly, it has been known to limit the amount of data that is prefetched so that it is generally inversely proportional to the degree of interleaving. Such a scheme reduces the likelihood of excessive prefetching, and therefore improves the use of available memory bandwidth.

Another factor that influences the performance of memory systems, including those with stream buffers, is the manner in which refreshing of the DRAM array is performed. Refresh is the means by which weakly-held charges that represent data in the array are periodically restored, so that the data is not lost. While refresh is clearly a necessary function, it nonetheless renders the array unavailable for normal accesses when it is being performed, and thus can have a negative performance impact. Accordingly, it is generally desirable to somehow limit the impact of refresh on normal data traffic, so that performance is not unduly reduced. Many techniques have been used to improve the scheduling of refresh to minimize its performance impact.

While the aforementioned techniques have indeed improved the performance of memory systems employing them, there nevertheless remains a need for improved memory system performance. Additionally, it is desirable to increase the efficiency of memory system components so that maximum performance can be squeezed out of the fixed costs that they contribute to the memory system.

SUMMARY OF THE INVENTION

It is an object of the invention to increase the performance of memory systems employing intermediate buffers generally and stream buffers in particular, by increasing the efficient use of the memory system data path and various stream buffer components. The invention has several aspects to achieve this objective.

According to a first aspect, the invention is a memory system having (1) a memory array having an output port coupled to a memory array bus; (2) a first latch whose data input is coupled to the memory array bus; (3) a second latch whose data input is coupled to the memory array bus; (4) a stream buffer having an input port and an output port, the input port being coupled to the data output of the second latch; (5) means for selectively coupling the data output of the first latch and the output port of the stream buffer to a system bus over which data from the first latch and from the stream buffer are to be transferred; (6) means for enabling the loading of the first latch from the memory array with data to be subsequently transferred over the system bus; (7) means for disabling the loading of the first latch from the memory array when the first latch contains data to be transferred over the system bus and the system bus is unavailable for the transfer of the data; and (8) means for enabling the loading of the second latch from the memory array with data to be subsequently stored in the stream buffer while the loading of the first latch from the memory array is disabled.

A memory system incorporating this first aspect of the invention has the ability to perform fills between the memory array and the stream buffer despite the presence in the first latch of data destined for the system bus. This arrangement is advantageous when for some reason the transfer of data from the first latch to the system bus is delayed. Such delay can arise, for instance, from the actions of flow-control mechanisms on the system bus. For example, the system bus may be temporarily stalled to prevent new data transfers until nodes on the bus digest previous transfers. Without the two-latch arrangement of the present invention, fills to the stream buffer would have to stop until the bus became unstalled and the data transfer completed. By removing this obstacle to stream buffer fills, this first aspect of the invention results in generally improved memory performance.

According to a second aspect, the invention is a method of operating a memory module in a memory system, the method comprising the step of prefetching blocks of data in response to predetermined conditions including the state of a fill limit indicator. The number of blocks of data that are prefetched while the fill limit indicator is not set is one less than the ratio of a maximum degree to which the memory module may be interleaved with other memory modules in the memory system to an actual degree of such interleaving, and the number of blocks of data that are prefetched while the fill limit indicator is set is the lesser of (a) the number of data blocks that would be prefetched if the fill limit indicator were not set, and (b) a predetermined number that is substantially less than the maximum degree of interleaving. In a preferred embodiment, the maximum degree of interleaving is four, and the predetermined number is one.

This second aspect of the invention allows prefetching behavior to be tailored to different operating environments in two ways. First of all, the amount of prefetching is roughly inverse to the degree of interleaving. This functionality reflects the fact that in an N-way interleaved system, a given memory module will generally service only one out of N sequential memory requests, so that the rate of prefetching may be relaxed accordingly without adversely affecting performance. In some computing environments, prefetching based solely on interleaving achieves superior performance. In other environments, however, the aggressive prefetching that would occur in lower-interleaved systems may not deliver optimal performance. Such lowered performance can arise if memory references tend to be non-sequential, so that memory bandwidth is wasted prefetching data that is never used. In such a case, the fill limit indicator can be set during system configuration to limit the amount of prefetching so that memory usage is more efficient.

A third aspect of the invention is a method of operating a memory system having the steps of (1) receiving read commands from a processor, each read command specifying a corresponding memory location to be read; (2) storing address values into a history buffer, each stored address value corresponding to the address of the memory location specified by a corresponding one of the read commands; (3) determining for each of the read commands whether a predetermined relationship exists between the address of the memory location specified thereby and any of the address values stored in the history buffer; (4) for those of the read commands for which the predetermined relationship is determined to exist, prefetching data from a memory at a corresponding memory location sequentially following the memory location specified by the corresponding read command and storing the prefetched data into a stream buffer; (5) determining for each of the read commands whether the data from the memory location specified thereby is stored in the stream buffer; (6) for those of the read commands for which the data from the memory location specified thereby is determined to be stored in the stream buffer, fetching the data from the stream buffer and returning it to the processor; and (7) for those of the read commands for which the data from the memory location specified thereby is determined to be stored in the stream buffer, refraining from storing into the history buffer the address value corresponding to the address of the memory location specified thereby.

By preventing the addresses of stream buffer hits from being loaded into the history buffer, this third aspect reduces the redundant detection of existing streams, and increases the chances of detecting new streams. This third aspect therefore increases the effectiveness of the stream buffer, and thus contributes to improved memory system performance.

The invention also includes a fourth aspect that reduces the impact of memory refresh on memory system performance. Memory system activity is monitored to determine the existence of the following conditions that define an additional refresh opportunity: (1) a pending memory read transaction that would otherwise require access to a memory array in the memory system has hit in a stream buffer in the memory system so that the requested data can be obtained from the stream buffer rather than the memory array; (2) refresh of the memory array has not yet been performed during a refresh window interval; and (3) there are no additional pending memory transactions either using or requiring the use of the memory array. When all these conditions exist simultaneously, memory refresh is initiated. By using the memory array for refreshing while a stream hit occurs, there is less chance that a refresh will collide with another read that requires the use of the array. As a result, overall performance is improved.

Finally, the invention also has a fifth aspect that helps enable a memory system to work on different computer system platforms. A memory system according to this fifth aspect has (1) a latch to hold an address received from a bus; (2) a first decoder coupled to the latch and configured to assert a first select signal appearing on an output thereof when the latch contains a first predetermined address value; (3) a second decoder coupled to the latch and configured to assert a second select signal appearing on an output thereof when the second decoder is enabled and the latch contains a second predetermined address value different from the first predetermined address value; (4) means for indicating whether either of the first and second select signals is asserted; and (5) means for enabling and disabling the second decoder. This fifth aspect allows the memory system to always be accessed via the first predetermined address, and to also be accessed via the second predetermined address when the second decoder is enabled. As a result, the memory system may be used in different systems having different I/O address maps without requiring redesign.

Other objects, features and advantages of the present invention are to be found in the detailed description that follows.

BRIEF DESCRIPTION OF THE DRAWINGS

An embodiment of the invention will be described with reference to the accompanying drawings, in which.

DETAILED DESCRIPTION

Figure 1:
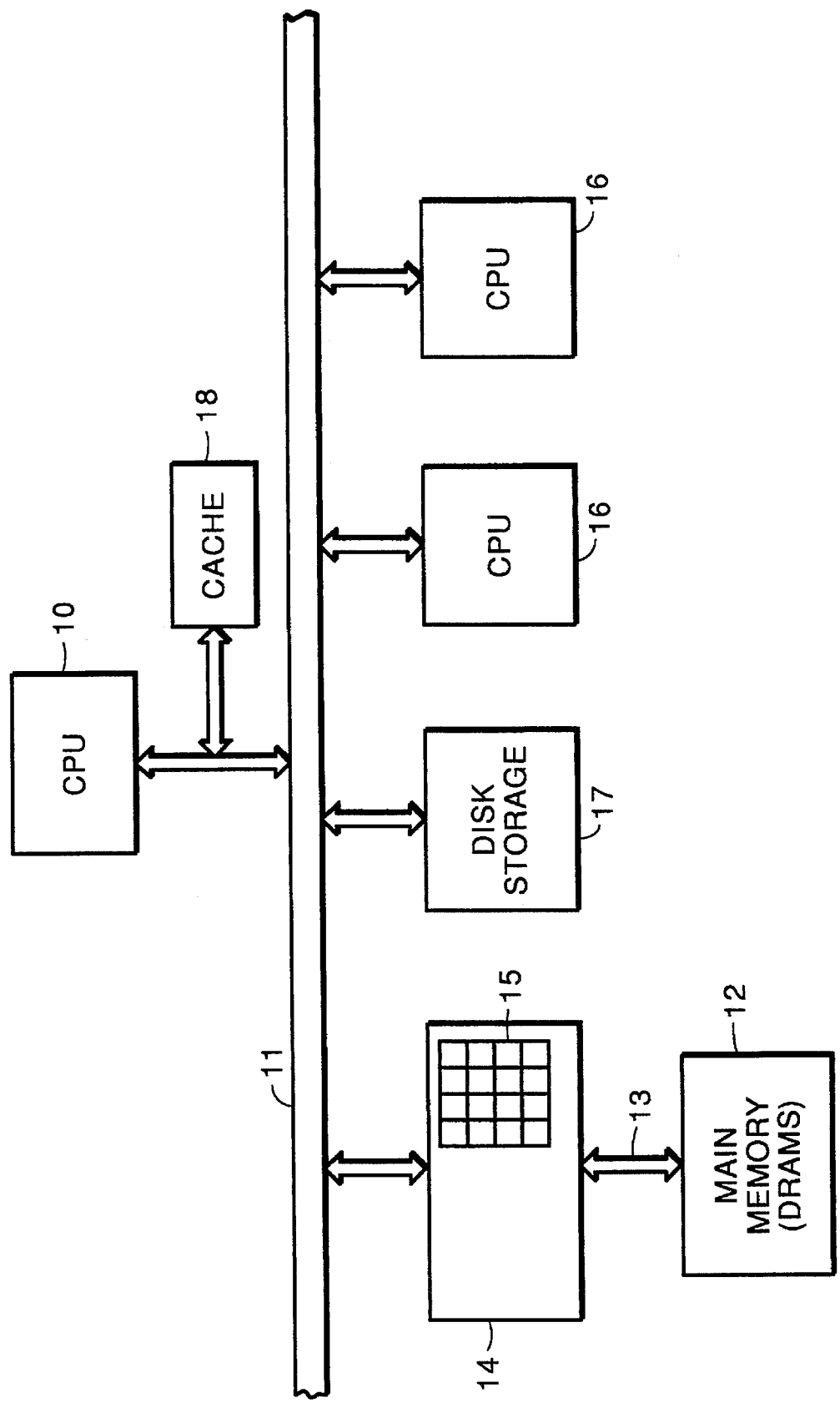
FIG. 1 is a diagram of a computer system in accordance with the principles of the invention.

FIG. 1 shows a computer system having a stream buffer in accordance with the principles of the invention. A CPU 10 is connected to a system bus 11 for access to various system resources. The CPU may be, for example, of the VAX-11 architecture as described by Levy and Eckhouse in "Computer Programming and Architecture: The VAX", 2nd Ed., Digital Press, 1989. A single-chip CPU of the VAX architecture is disclosed in U.S. Pat. No. 5,006,980, issued to Sander, Uhler & Brown, and assigned to Digital Equipment Corporation. The CPU 10 also may be of an advanced 64-bit RISC architecture as disclosed in application Ser. No. 547,630, filed Jun. 29, 1990, also assigned to Digital Equipment Corporation. Alternatively, of course, the CPU may be of many other types, such as the Intel 386 or 486 architecture, or MIPS R3000 or R4000 RISC architecture. The system bus 11 may be any of the standard bus specifications used for any of the many commonly-used CPUs, but in an example embodiment is a VAX bus.

A main memory 12 is connected to the system bus 11 by a memory bus 13 and a memory interface or control 14 containing a stream buffer 15 according to features of the invention. The purpose of the stream buffer 15 is to hold read data prefetched from addresses following a sequential read access received from the CPU 10. That is, when a read request for a given address X is received by the control 14 from the CPU 10 on the system bus 11, this address X is stored to see if a read for the next sequential location (cache line) X+1 is soon requested. If so, the response is to fetch the data at address X+1 from the memory 12 and send it back to the CPU 10 on the system bus, then to fetch sequential data at addresses X+2, X+3, etc., and store this data in the stream buffer 15. The principle of locality suggests that the CPU will send memory requests for the sequential locations X+2, X+3, etc., and when this happens, the access time in responding to these subsequent requests is much shorter when the data is in the buffer 15 than when a read access to memory 12 must be made. The bus cycle for the system bus 11, and the way the CPU 10 operates, are such that the time between read requests from the CPU for sequential data will be sufficient to allow for memory cycles on the memory bus 13 (particularly, page mode accesses) to be executed to fill the buffer 15 with the desired data stream, before the CPU makes the memory requests. The stream buffer 15 is large enough to hold a number of data steams, for example, four streams. Thus, read accesses for data and instructions may be in different pages, and more than one task may be executing on the CPU 10, so several streams may be working simultaneously; four of these can be accommodated in the stream buffer 15 of the example embodiment. The stream buffer 15 is constructed as a set of four FIFOS, with four entries for each FIFO, as will be explained.

In addition to the CPU 10, other CPUs 16 as seen in FIG. 1 may be accessing the memory 12 by the system bus 11 in a multiprocessor system, so there may be streams resident in the stream buffer 15 for more than one processor, as well as more than one process. Various other system resources such as a disk storage facility 17 are commonly connected to the system bus 11.

Memory references made by the CPU 10 to the memory 12 are for a cache line, which in typical embodiments is 128-bits or 256-bits, rather than for a word. A cache 18 holds a subset of data from memory 12, and is accessed in a much shorter cycle than an access to memory 12. A large percentage of the memory requests made by the CPU 10 result in cache hits (perhaps 90% or more) and so require no transaction on the bus 11. When a cache miss occurs, however, the data from the requested location in memory 12 is fetched via the bus 11, and the entire cache line containing this memory location (even if the request is for only a 32-bit word) is fetched from memory and used to fill a line of the cache 18. Memory references are therefore on even cache line boundaries, and so when "incrementing by+1" is referred to herein it is understood that the addresses are incremented by+16 byte addresses or+32 byte addresses, or whatever the configuration requires. The address sent out on the bus 11 from the CPU is truncated since some low-order bits of the internal CPU are never needed in addressing the memory 12. The cache 18 may be internal to the microprocessor chip which implements the CPU 10, or external; more often, a combination of on-chip (first-level) and external (secondary or back-up) caches are used. In a particular embodiment, the cache 18 is direct-mapped, meaning that only one cache location is available for a given index number, i.e., all memory references having the same index will map to the same location in the cache. This is material to the address transposing mentioned below in reference to exchange transactions.

Figure 2:
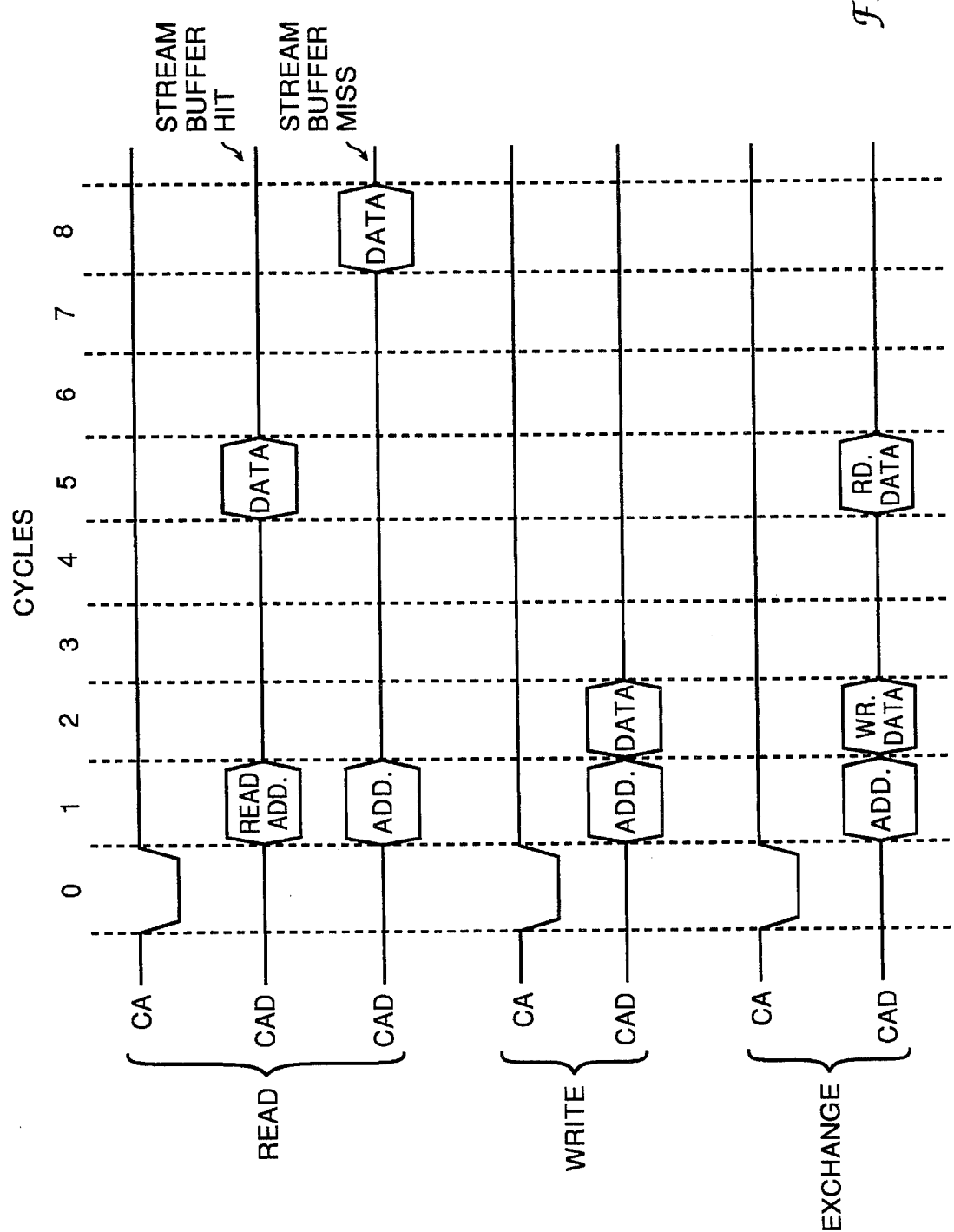
FIG. 2 is a timing diagram showing events vs. time for bus cycles in the system of FIG. 1.

In a particular embodiment, the bus 11 is a multiplexed command/address/data bus on which memory requests are sent by the CPU 10 in the manner illustrated in FIG. 2. A memory request is initiated in cycle-0 by a command strobe CA, an output from the CPU. In cycle-1, the bus 11 is driven by commands and address bits labelled CAD (command/address/data) in FIG. 2, in the first example representing a read request. If the requested data is in the stream buffer 15, the data is returned to the bus 11 in cycle-5, but if the requested data is not in the stream buffer the data is returned to bus 11 in cycle-8. The difference of three cycles represents the delay in accessing the memory 12, compared to getting the data directly from the stream buffer 15. A write cycle as illustrated in FIG. 2 is initiated by a CA strobe as before, and the write address and write command is asserted on bus 11 by the CPU in cycle-1, followed immediately by the write data in cycle-2. The delay before another memory transaction can begin on the bus 11 following a write depends upon whether the write can be made to a write buffer (not shown) or must be sent to memory 12.

The memory 12, in one embodiment, supports a so-called "exchange" transaction, which consists of both a write and a read in one bus transaction. This is ordinarily used to write back a cache line from the cache 18 to memory 12 and to read a cache line; this can be done, of course, only if the addresses are appropriate, since only one cycle of address information is sent. In FIG. 2, an exchange command begins in cycle-0 with a CA strobe, the address and command is asserted by the CPU 10 on the bus 11 in cycle-1, and the write data is asserted on the bus 11 by the CPU in cycle-2. If the write can be done to a write buffer, and the read data is in the fill buffer 15, it is returned on bus 11 in cycle-5, or if an access to memory 12 for the read is needed then read data is returned in cycle8. An exchange transaction is an atomic operation that swaps one cache line from the cache 18 with another line read from memory 12 (or from buffer 15). This operation is used to enhance performance of the memory system when filling a cache location in the instance of a cache miss to a "dirty" cache line (one that has been written to). An exchange transaction uses the address fields sent in cycle-I to send the unique cache tag address for the location in memory to write back the dirty cache line, and also the cache tag for the cache line to be loaded into the cache 18. In addition, a single cache index field is sent for an exchange transaction. Thus, two cache tag addresses (16-bits each) and one index (13-bits) are sent on bus 11 in cycle-2. Note that the same index is used for both the write back and the cache fill data, so the address bits must be appropriate.

Figure 3:
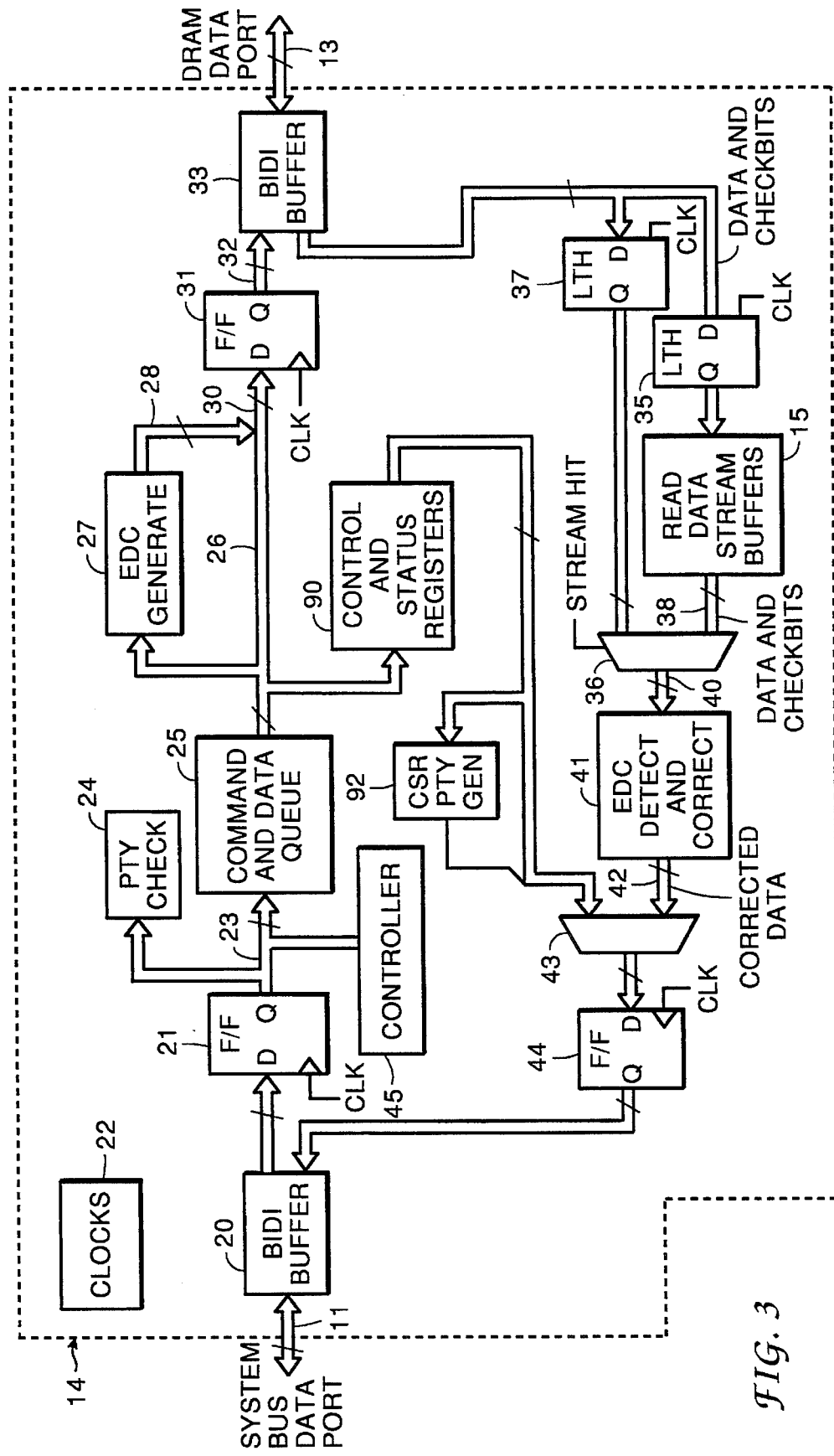
FIG. 3 is an electrical diagram in block form of a memory controller used in the system of FIG. 1 and employing features of the invention.

Referring to FIG. 3, the controller 14 is shown in more detail. Write data moves from left to right at the upper part of FIG. 3, from system bus 11 to memory bus 13. Read data, on the other hand, moves from right to left at the lower part of FIG. 3, from memory bus 13 to system bus 11. The stream buffer 15 is in the read data path. A bidirectional bus interface 20 accepts data and commands (read and write requests, including addresses, as in FIG. 2) from the system bus 11, and applies the received information to a flip/flop 21 clocked by a local clock source 22. The output from the latch 21 is applied by lines 23 to a parity check circuit 24; if parity does not check then a fault is signalled. The information on lines 23 is also applied to a command and data queue 25. A read request is held for execution, with just the address and commands being sent to the memory 12 (if access to memory 12 is needed) under control of the controller, but a write request has data to be sent on to memory 12. Output from the command and data queue on lines 26 for a write request is applied to an ECC generator circuit 27 where ECC bits are calculated and output on lines 28. The ECC bits on output 28 are added to the data on lines 26, producing a full data word including ECC bits on lines 30. If the data width at the output lines 26 is 128-bits, for example, then the ECC circuit 27 may generate a 12-bit ECC field on lines 28, so the total width of the output on lines 30 is 140 bits. The flip/flop 31 provides an output 32 to a bidirectional bus interface 33 which interfaces with the memory bus 13.

When a read request requiring an access to memory 12 is being executed, the read data path receives data from the memory bus 13 via bidirectional interface 33 and clocked latch 34. The read data can be applied to the stream buffer 15 via latch 35, or can be applied to a multiplexer 36 via latch 37 to bypass the stream buffer. In executing a read request where the data requested is not in the buffer 15, the read data returned to the unit 14 from the memory 12 is sent directly back toward the CPU through the latch 37 rather than being stored in the stream buffer 15. If requested data is in the stream buffer 15, however, it is applied to the multiplexer 36 by lines 38, without needing a memory access to DRAMs 12. Selection of either the latch 37 or the stream buffer 15 as the output of the multiplexer 36 is made by a stream hit input 39.

The output 40 of the multiplexer 36 is applied to an error detection and correction (EDC) circuit 41. The circuit 41 accepts the 140-bit wide data input on lines 40 and uses the 12-bit ECC field to determine if the 128-bit data field is correct, and toggles incorrect bits if found. If more than two bits are incorrect, a fault is signaled and the data is not corrected. The output 42 of the EDC circuit 41 is 128-bits wide and is applied to a multiplexer 43 for coupling back through a clocked latch 44 to the bus interface 20, from which read data is sent back to the CPU 10 via system bus 11. A controller 45 receives commands loaded to the memory control 14 from the CPU 10 via bus 11, and generates the hit signals and various control signals for the stream buffer, as will be described.

Figure 4:
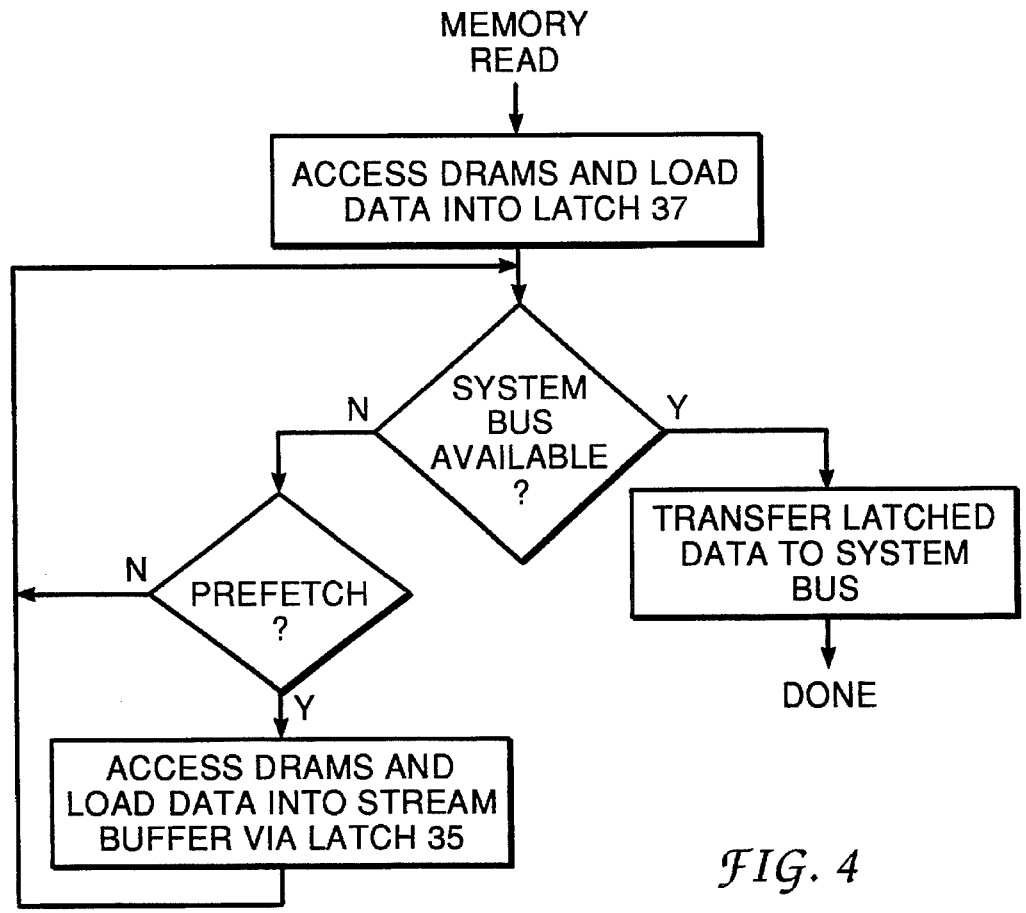
FIG. 4 is a flow chart showing one operational mode of the memory controller of FIG. 3.

One significant operational characteristic of the controller 14 of FIG. 3 is described in the flow chart of FIG. 4. When executing a read command that does not hit in the stream buffer 15, the controller 14 accesses the DRAMs in memory 12 in a conventional manner and loads the data into the latch 37. At this time, the system bus 11 may be temporarily unavailable for a variety of reasons. The controller senses bus availability by monitoring a bus stall signal, not shown in the Figures, that is used by some bus nodes to stall the system bus 11 while the asserting node catches up. If the bus is available, i.e., the stall signal is not asserted, the controller transfers the data in latch 37 through the remainder of the read path and onto the system bus 11. If the bus is not available, then the data in the latch 37 must be held until the read can be completed. However, the memory 12 can still be accessed for prefetches bound for the stream buffer 15, because of the presence of the additional latch 35. If a stream buffer prefetch is needed before the read can complete, the controller 14 accesses the DRAMs and loads the data into the stream buffer 15 via the latch 35. Additional prefetch cycles can also be carried out. When the system bus 11 becomes available, the controller 14 transfers the data from latch 35 through the remainder of the read data path to the system bus 11.

Returning briefly to FIG. 3, the controller 14 also has a block 90 that contains several control and status registers or CSRs. These registers generally hold two types of information: (1) control information provided by a CPU to tailor the operation of the controller 14; and (2) status information collected during the operation of the memory system and provided to the CPU for monitoring purposes. An example of control information is information indicating whether certain types of error checking should be performed or not. An example of status information is whether or not errors have been detected by the EDC detection logic 41.

A CPU accesses the CSRs in the CSR block 90 by issuing conventional read and write commands on the system bus 11, each read and write command having an address indicating that the target of the command is one of the CSRs. The CSR block 90 contains address decoding circuitry that is used to determine which CSR is being accessed. Address decoding is done in two stages. The first stage, involving the decoding of higher-order address bits, determines whether a given address falls anywhere in the range of addresses allocated to the CSR block 90. The second stage, in which only lower-order address bits are decoded, determines exactly which CSR in the CSR block 90 is being accessed.

Figure 5:
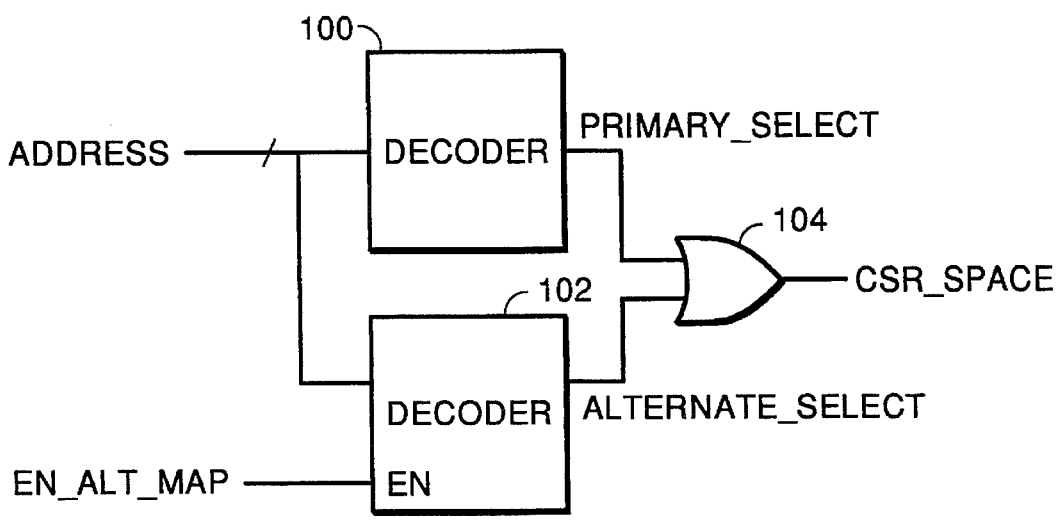
FIG. 5 is a schematic of an address decoder within the memory controller of FIG. 3.

One unique feature of the first-stage address decoding circuitry within the CSR block 90 is shown in FIG. 5. There are two first-stage decoders 100 and 102 having their outputs OR'd together via OR gate 104. The first decoder 100 is configured to detect a first predetermined address that defines a primary CSR space, and the second decoder 102 is configured to detect a second predetermined address different from the first and defining an alternate CSR space. A CPU can always access the CSRs via the primary CSR space. Also, if the signal EN_ALT_MAP is asserted, a CPU may also access the CSRs through the alternate CSR space. The signal EN_ALT_MAP is itself an output of a configuration CSR within the CSR block 90. As mentioned above, this primary-secondary decoding scheme advantageously enables the controller 14 to easily work with different CPUs or in systems having different address space maps.

Figure 6:
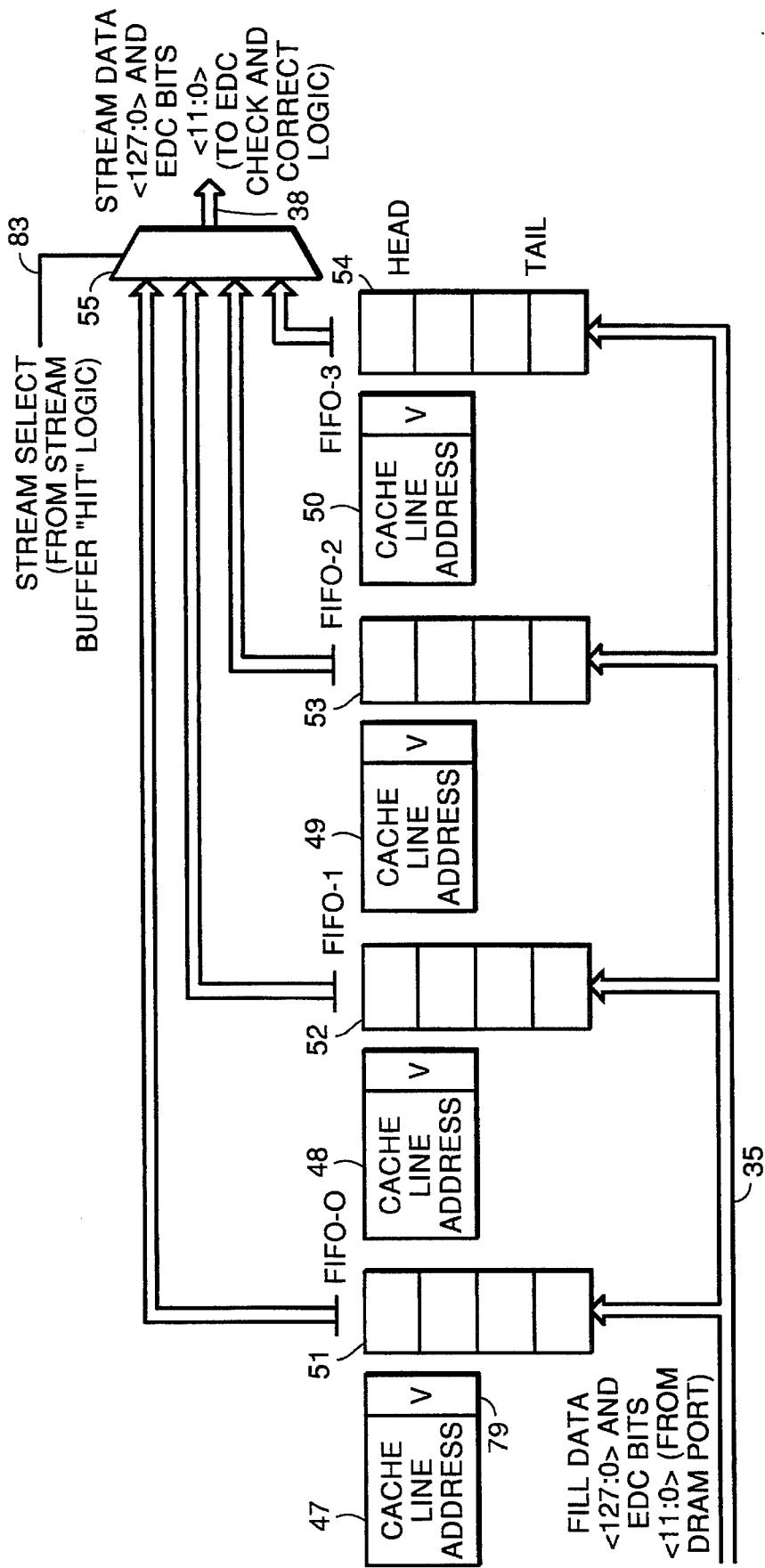
FIG. 6 is an electrical diagram in block form of stream buffer FIFO logic used in the controller of FIG. 3, according to one embodiment.

Referring now to FIG. 6, the stream buffer 15 is configured in the example embodiment as four FIFOs 51, 52, 53 and 54. Each of the FIFOs holds up to four data blocks, with each data block containing 128-bits of data plus the 12-bit EDC check bit field, as seen in the Figure. Each FIFO has an associated head address register, shown in FIG. 6 as 47, 48, 49 and 50, that maintain the effective cache line address of the data currently held in the head of the corresponding FIFO. In addition to holding the cache line address, each of the head address registers provides a valid bit which indicates whether the corresponding FIFO has valid data at its head location. The four FIFOs rely on a single control mechanism to perform the loading of read data form the DRAMs of memory 12 via lines 35 into the tail of the FIFO, and the subsequent extraction of read data from the head of the FIFO for delivery via output 38 to the system bus 11. A multiplexer 55 selects one of the four 140-bit outputs 56 from the FIFOs to apply to the lines 38 when a stream buffer hit is detected.

Figure 7:
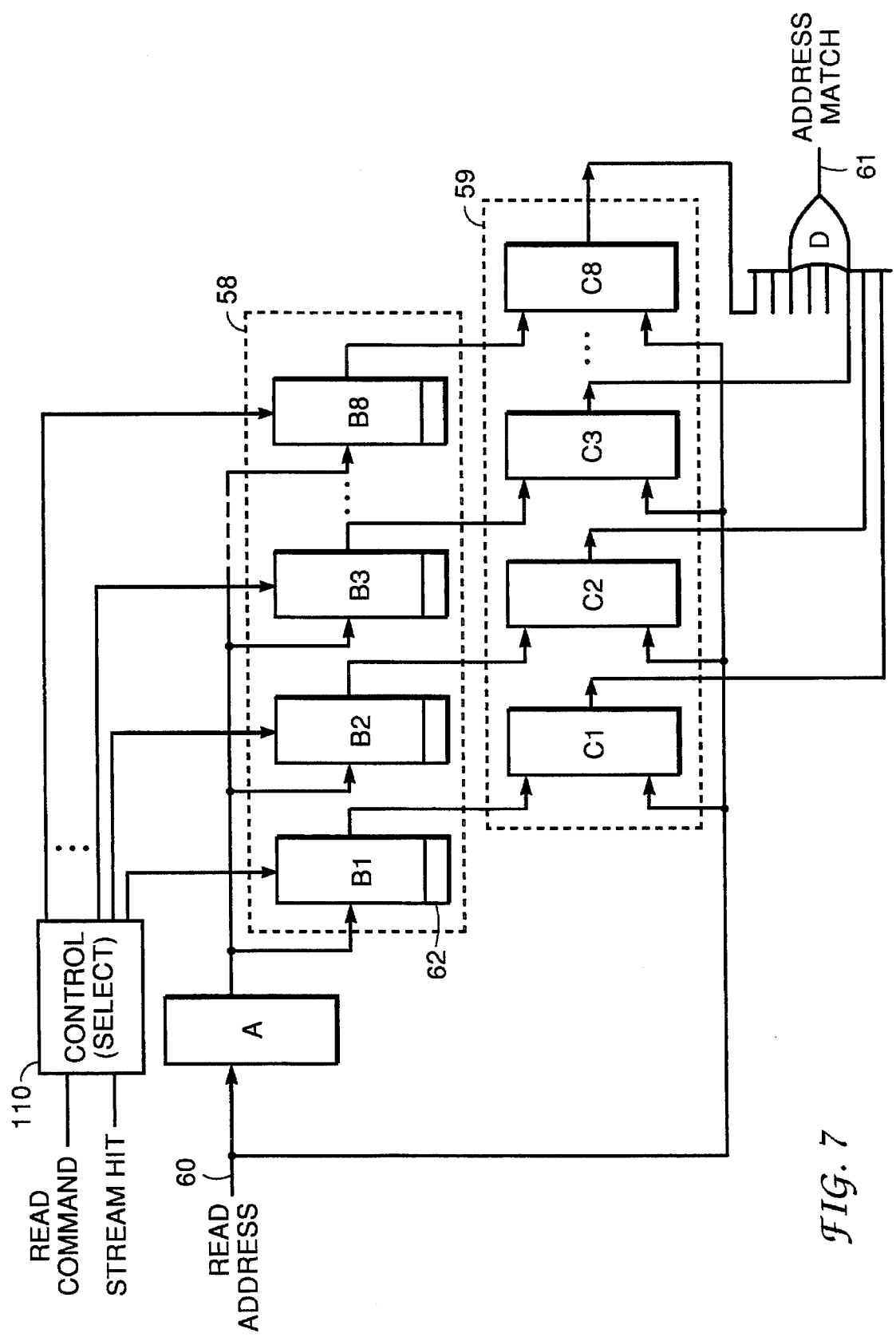
FIG. 7 is an electrical diagram in block form of stream detection logic used in the controller of FIG. 3, according to one embodiment.

The stream detection logic of FIG. 7 is part of the controller 45 of FIG. 3 and is used to determine when a CPU 10 is in the process of reading contiguous locations in memory 12, which is the situation where the beneficial effects offered by the prefetching of data can be utilized. This circuitry is shared by all the stream buffers, i.e., only one copy of the stream detection logic is required. The intent of the detection logic is to anticipate the subsequent need for data from memory 12, prior to the actual read command arriving in unit 14 requesting that data. The stream detection logic keeps a record of the addresses in memory 12 of the previous eight read transactions. This record is kept in a history buffer 58 having eight locations B1–B8 that are loaded by a control block 110. The first location B1 is loaded from the incoming read cache line address through an adder A which adds 1 to the incoming read cache line address (i.e., incrementing) prior to loading into location B1. When the next read request is received, the corresponding cache line address is incremented by adder A before being loaded into location B2, and likewise each subsequent read address received from CPU 10 is incremented and loaded into the next location, proceeding through location B8, whereupon the ninth read request has its cache line address incremented and loaded into location B1, thus overwriting the previous contents of that element. In this manner the eight locations within the history buffer cache are used in a true round robin basis, such that at any given time the history buffer contains the cache line addresses of the last eight read requests.

Comparators 59, connected to receive the incoming read address on line 60 and the output of one of the locations B1–B8 of the history buffer 58, compare each subsequent read transaction address from latch 21 of FIG. 3 to see if the new address of an incoming read request is contiguous to any of the recorded addresses held in the history buffer. (If cache line addresses, on even 256-bit boundaries, are sent on bus 11, then "contiguous" means X+1). If the new address is determined to be contiguous to any one of the previous eight addresses in the history buffer 58, a new read stream is declared by the address match signal on line 61. This results in one of the stream buffers 51–54 being allocated to this new stream, to be used to store data from the memory 12 to be prefetched by the controller logic.

Each location B1–B8 within the history buffer 58 also maintains a single status bit 62, which is referred to as the valid bit. Each valid bit is set whenever a new read address is loaded into the corresponding history buffer location B1–B8. Each valid bit indicates whether the contents of the corresponding location B1–B8 was loaded during normal system operation, and therefore protects against spurious operation as a result of initialization after the system is powered up. If the valid bit 62 is not set in a history buffer location, that location is prevented from making a successful compare against any new address, and therefore cannot cause a stream to be detected. The re-detection of existing streams is prevented by first calculating the effective array address from the new address on bus 11, and then comparing that to the entries already contained within the head address registers 47–50 for the four stream buffer FIFOs 51–54. That same address generation logic used by the fill logic can be used for this purpose. If the head of any of the stream buffer FIFOs 51–54 has an entry that corresponds to the effective array address, the "existing-stream" signal will inhibit the creation of a new stream.

The control block 110 also receives the signal STREAM HIT. When a read request results in a stream hit, the control block 110 refrains from updating the history buffer 58 as it otherwise would. The rationale for this operation is that a stream hit indicates that a corresponding stream already exists, so there is no need to use the history buffer to unnecessarily re-declare the stream in the future. It thus serves to preserve the history buffer entries B1–B8 for their proper use, i.e., searching for new streams, and accordingly enhances the performance of the stream buffer 15.

Figure 8:
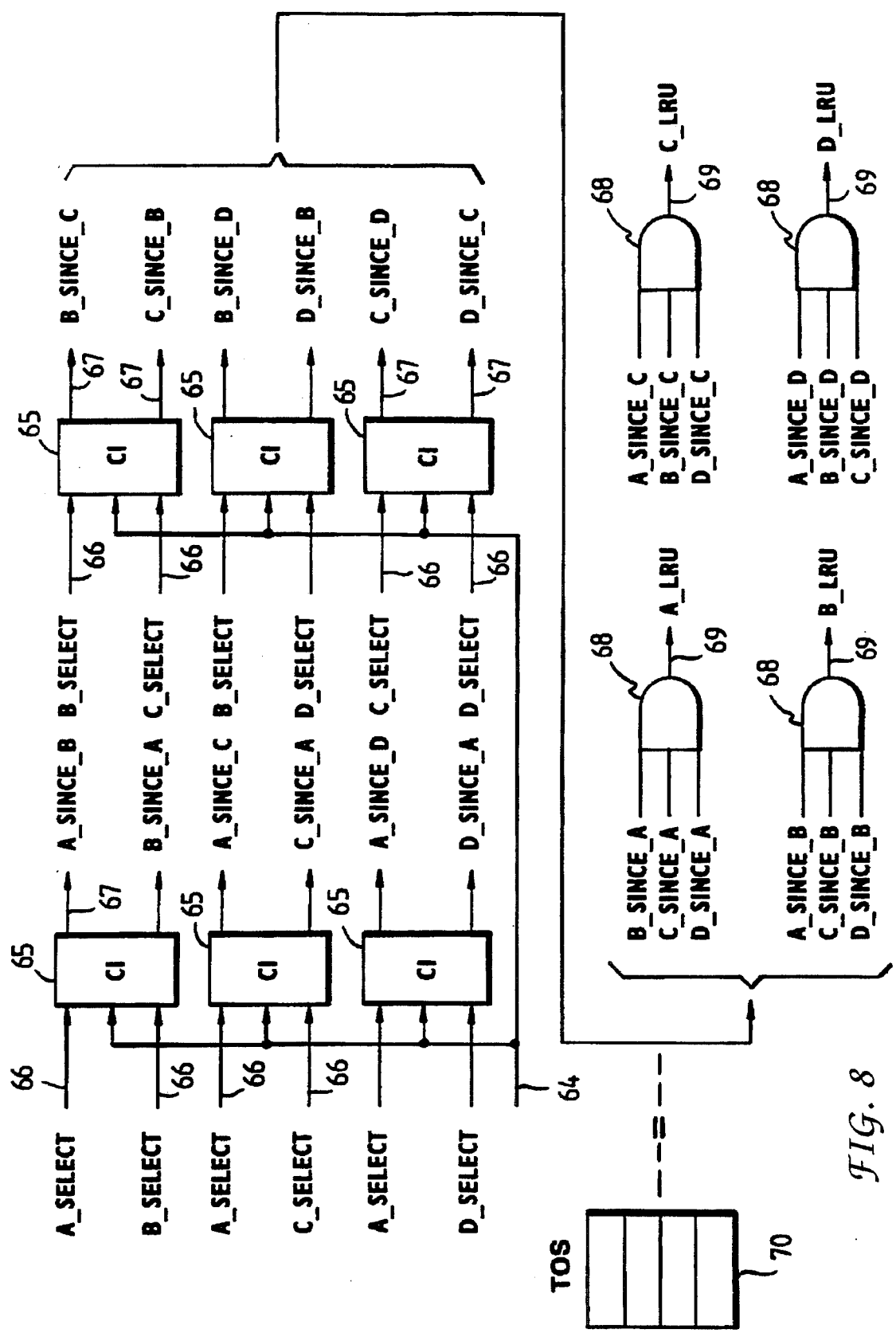
FIG. 8 is an electrical diagram in block form of stream buffer allocation circuit used in the controller of FIG. 3, according to one embodiment.

FIG. 8 shows stream buffer allocation circuitry that is also part of the controller 45 of FIG. 3. The allocation circuitry is shared by all the stream buffers, i.e., only one copy of this allocation logic is required. The stream buffers 15 are allocated on a modified least-recently-used (LRU) basis, so that the stream buffers are utilized in an efficient manner. When a buffer hit is signalled on line 83 by the circuitry of FIG. 10, described below, an input 64 to a set of six J-K flip-flops 65 causes the A-sel, B-sel, C-sel, etc., inputs 66 to be evaluated, and outputs 67 are valid until the next hit. These outputs 67 indicate for each pair of the four buffers 51–54 which one was more recent. The outputs 67 are applied as inputs to a set of four AND gates 68, producing outputs 69 in the controller 45 indicating which one of the four buffers 51–54 is LRU. When a buffer is selected at the next hit, it will thus be the one indicated by the one output 69 that is asserted. This one output 69 is then deasserted, and the next LRU is asserted (one of the other outputs 69 is asserted). In effect, the logic provides a stack 70 of four buffer identities to indicate the relative time between successful hits on each of the four buffers 51–54. When a buffer 51–54 is allocated upon the event of a hit, the identity of that buffer is placed on the bottom of the stack 70, pushing the other buffer identities up the stack (i.e., as indicated by the order the outputs 69 will be asserted). As time progresses, memory read transactions that hit on the contents of a buffer 51–54 push the corresponding buffer identity to the bottom of the stack 70. The buffer identity on the top of the stack is always the LRU buffer, and would therefore be the next buffer to be allocated when the next new read stream is detected. In the event that a stream buffer 51–54 is invalidated as discussed below, the identity of that buffer is placed immediately at the top of the stack 70, and therefore this buffer will be the next buffer to be allocated when the next read stream is detected.

Figure 9:
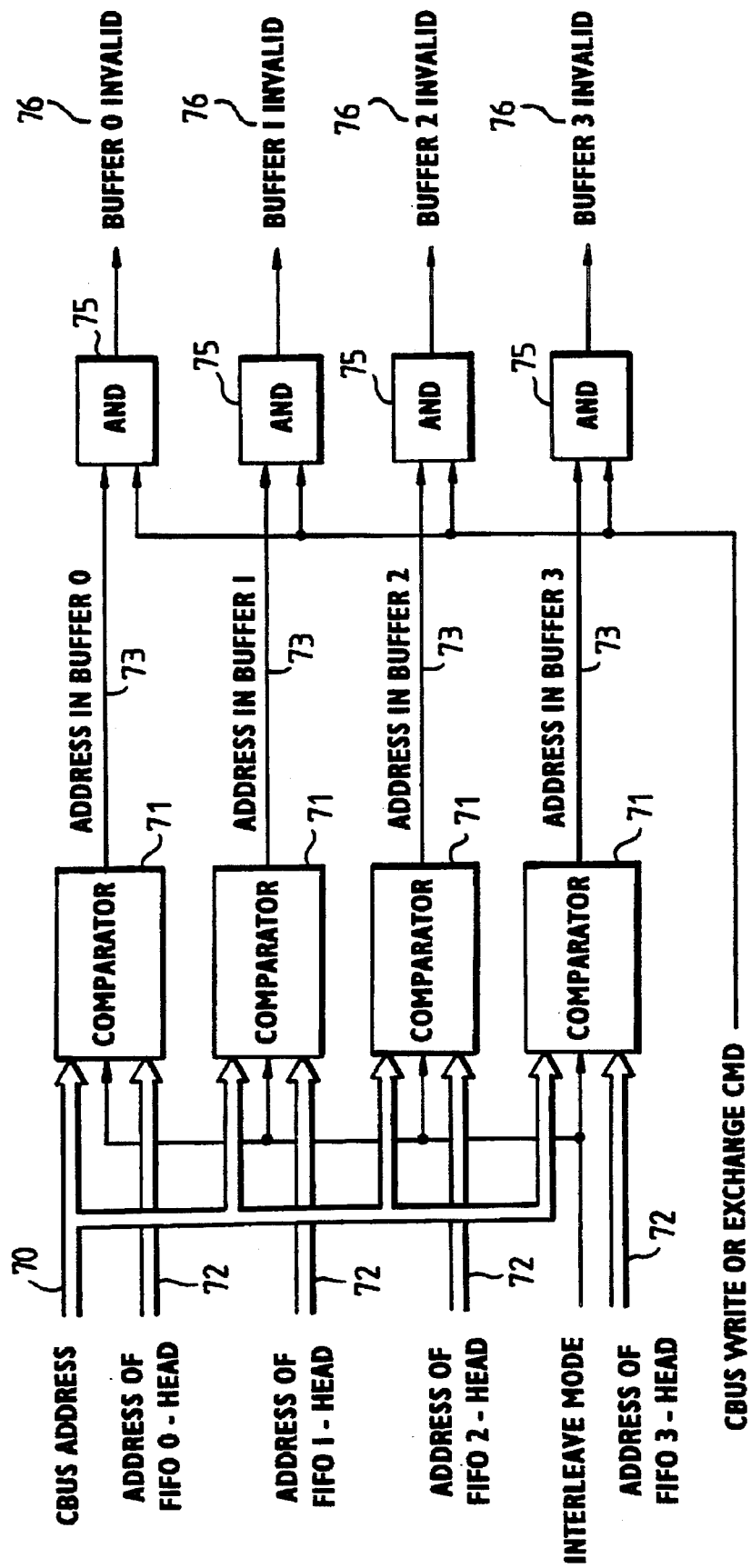
FIG. 9 is an electrical diagram in block form of stream buffer invalidate circuit used in the controller of FIG. 3, according to one embodiment.

Referring to FIG. 9, the stream buffer invalidate circuit is shown in detail. Data in the stream buffer 15 can become "stale" when a write-to-memory operation occurs for a memory location contained in the buffer 15. In order to assure that the read data residing in a stream buffer 51–54 is always "coherent", all system memory write transactions are checked to see whether an address of the write operation appearing on the bus 11 coincides with an existing stream buffer 51–54 entry. Each write transaction address on input 70 from the bus 11 (e.g., from latch 21) is compared in four compare circuits 71 with inputs 72 from the four stream buffer head address register entries 47–50, producing four comparison outputs 73; these outputs 73 are each ANDed with a write command signal from the bus 11 in gates 75, producing a "buffer invalid" output 76 for each of the four stream buffers; this output 76 is used to toggle the valid bit 79 for the corresponding buffer location. If a write transaction address on input 70 from the bus 11 is equal to any address potentially residing in a stream buffer, that entire stream is declared invalid, thus preventing any of the data in that stream buffer from being erroneously supplied to CPU 10. Once a stream buffer is invalidated it is available to be re-allocated to the next detected read stream.

In addition to the invalidation of individual streams (individual buffers 51–54) due to memory write or memory exchange commands, all four stream buffers 51–54 are invalidated at any time the memory configuration control register is written, and at any time that a command parity error is detected. In the case of rewriting the configuration register, re-configuration of the memory module address or interleaving assignments makes the address relationship of the contents of the stream buffers 51–54 incoherent, while in the case of command parity error the failed transaction may have been a write or exchange to a memory location whose data is currently resident in a stream buffer entry, and which under normal conditions (i.e. no command parity error) would have resulted in an invalidation of the appropriate stream buffer. These functions protect against the possible reading of "stale" or incoherent data.

Figure 10:
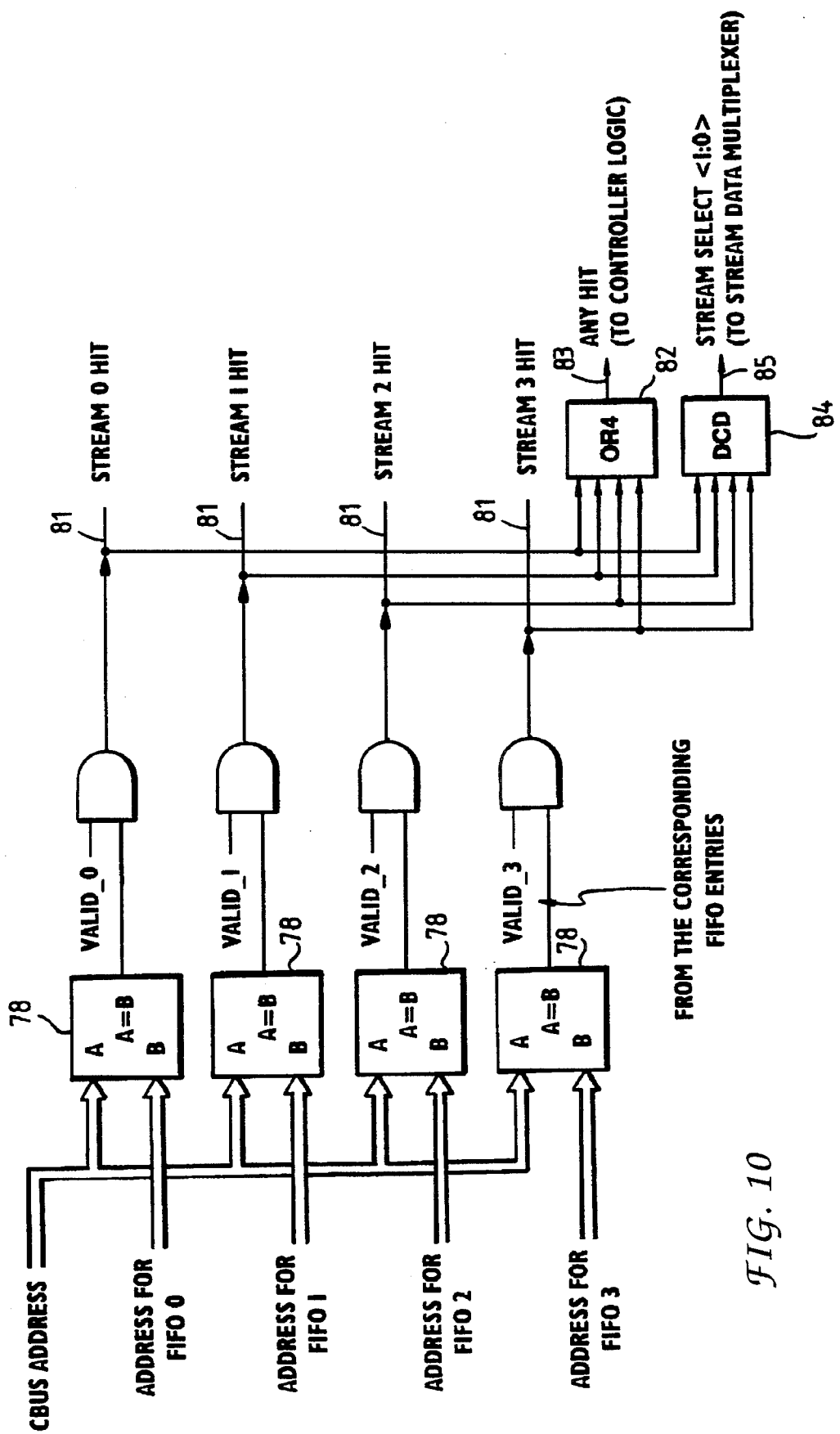
FIG. 10 is an electrical diagram in block form of stream buffer hit logic circuit used in the controller of FIG. 3, according to one embodiment.

Once a stream buffer 51–54 has been allocated and some amount of prefetched data has been placed in the FIFO, the stream buffer hit logic of FIG. 10 compares incoming read or exchange command addresses to detect a comparison between the requested address and the address of the data at the head of each stream buffer FIFO entry. If a compare of these two addresses is successful, read data may be delivered directly from the stream buffer 51–54 to the system bus 11, without performing a (much slower) access to the DRAMs of memory 12. Read latency should be reduced to the minimum architected read transaction delay (i.e., "zero stall states") of seven system bus cycles (for an example embodiment) upon a successful hit on a stream buffer.

The circuitry of the hit logic of FIG. 10 shows the logic supporting "hit" detection for one embodiment. As there are four stream buffers 51–54, four comparisons are performed in parallel in the comparators 78. The outputs of the comparators 78 are gated by the state of their respective valid bits 79 which exist within each of the stream head address register entries 47–50. If any of the resultant hit signals on lines 81 become asserted during a read (or exchange) operation, an OR gate 82 produces a "hit" signal on line 83 to inform the memory control and system bus control logic which will supply the appropriate sequencing of the memory 12 to account for shorter read latency, and will inhibit DRAM accessing of the memory 12. Additionally, the four hit signals on lines 81 are combined in a coder circuit 84 to generate a 2-bit stream select on lines 85. The stream select is used to gate the correct FIFO data through a 4:1 multiplexer 55 to the lines 38 on the way to the system bus 11.

Figure 11:
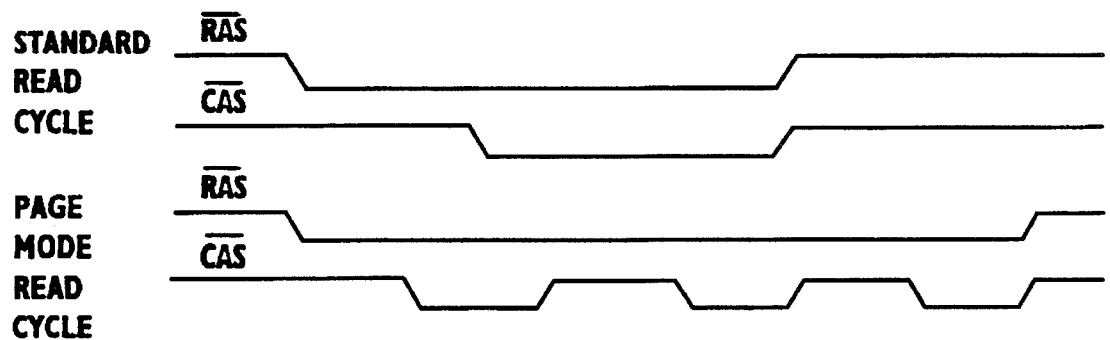
FIG. 11 is a timing diagram of events vs. time for a DRAM implementing a page mode operation.

The stream buffer of the invention is particularly suitable for use with DRAM memory devices implementing page mode. A Dram device of the type commercially available in 1-Mbyte and 4-Mbyte sizes has a row length of say, 512, 1024 or 2048 cells (depending upon layout of the chip), and when a read access is made using a row address and RAS, any of the columns of this row may then be accessed (without asserting a new row access) by merely toggling CAS and asserting a new column address, as illustrated in FIG. 11. The page mode access time is much shorter than RAS-CAS access time.

When either a new read stream is detected, or a continuing read stream causes a stream buffer 51–54 to transition to an "empty" condition, a stream buffer fill circuit in controller 14 will fetch data from the appropriate DRAM address in memory 12 and place it into the desired stream buffer FIFO 51–54. The stream buffer logic generates the correct DRAM address from the incoming memory address, complete with appropriate incrementing, while accounting for interleaved configurations and the effect on the availability of page mode accesses of the DRAMs of the memory 12.

In Tables 1 and 2 the address bits used to address the memory 12 are shown in the left-hand column (called Logical Signal); these include row address bits 0–9 and column address bits 0–9 (called RW Col Bits or read/write column bits) plus read/write bank select bits 0–1 and board select bits 0–8. For exchange operations, a different combination is used for the column address, bank select and board select as shown. In the six right-hand columns the address bits of the bus 11 (CAD or command/address/data bits) are shown. Note that there is a gap between CAD bits <31> and <64> because in the example embodiment the memory system is implemented in two slices, using a 128-bit bus 11. The command/address/data for each half is sent separately on the bus 11, using bits <31:0> and <95:64> for one half and bits <63:32> and <127:96> for the other. Thus the tables 1 and 2 represent the address bits on bus 11 for one half, and corresponding numbers would be used for the other half.

A memory system can be constructed using 1-M, 4-M, or 16-M DRAM devices, for example, and the boards can be laid out to provide one-way, two-way or four-way interleaving. In an example embodiment, "by-4" DRAM devices are used. Two or four banks of DRAMs may be used in the configuration, using the address transposition set forth in Tables 1 and 2. This provides a memory size for the memory 12 of 16-Mbyte or 32-Mbyte if 1-Mbit DRams are used, or 64-Mbyte or 128-Mbyte if 4-Mbit DRAMs are used.

The principle used in selecting the address bit transposition in Tables 1 and 2 is that the row address bits going to the DRAMs in memory 12 are a subset of the index address (i.e., tag bits aren't used as row address bits).

Referring to Table 1 and Table 2 it can be seen that when the memory is configured under one-way interleaving, the two least significant column address bits correspond to the two memory bus address (bus 11) least significant bits, and therefore the array module is capable of performing up to four page mode read cycles. This means that, once a DRAM address is established when filling a steam buffer entry, successive page mode reads can be preformed, filling multiple locations in the steam buffer, at substantially higher performance than if a corresponding number of entries were to be filled using a full RAS-CAS read cycle for each entry.

From Table 1 and Table 2, it can be also seen that if the array module is configured under two-way interleaving, the memory bus LSB becomes part of the board select field, leaving only the next higher LSB for use as the column address LSB. Therefore, a maximum of two page mode cycles may be performed under this configuration for the purpose of quickly filling a stream buffer. Further, if the memory module is configured under four-way interleaving, neither of the memory bus address LSBs correspond to the column address LSBS, and therefore no page mode read operations are possible. Any filling of a stream buffer in this case must be done as individual RAS-CAS read operations to the DRAMS.

Table 1 and Table 2 provide the matrices used to manipulate the incoming memory bus address to provide for proper board select, bank select, and DRAM address generation, for 1-Mbit and 4-Mbit DRAMS, respectively. Additionally, the effects of various configurations on the column address bits involved in the stream buffer fill logic are shown.

There are three methods in which the adaptive look ahead buffer fill cycle optimization balances the memory resources. These are: (1) adjusting the size of the fill based on the mode of interleaving, (2) dynamically adjusting the size of the fill to minimize read latency as seen by the requesting node, and (3) aligning the fill address to the beginning of a page.

The first method uses the interleaving configuration mode of the memory module in the system and from that information determines the number of look ahead locations it should read from memory and store in the buffers 51–54. This is based on Table 1.

For the four-way interleaved module only one fill read is performed. This is because there typically will be three sequential reads (one read to each of the other three modules in the four-way interleaved set) before the next time the process comes back to read the data that ideally will already be resident in the stream buffers. This means that there are three transaction periods that are opportunities for a given module to fulfill the look ahead fill read operation, without adding delays to the next read operation in the stream to that module.

In the two-way interleaved case the frequency of reads to a single module by a single process can double from the four-way interleaved case, because a sequential read stream will land on a particular module one out of two instead of one out of four times. Therefore by doubling the number of fills performed for a given memory cycle the number of times the memory must be accessed is equal to the number of times the memory must be accessed for a four-way interleaved module. By the same reasoning that the number of reads is doubled for a two-way interleaved board, the number of reads for the one-way interleaved configuration is quadrupled, where all reads in a stream are to a single memory module.

There is another feature of the controller 14 that comes into play in the one-way interleaved case. As noted, the desirability of prefetching is based on the principle of locality of memory references. Some programs, however, do not exhibit sufficient locality to justify extensive prefetching. Accordingly, it is desirable to reduce the amount of prefetching that would otherwise occur in some one-way interleaved systems. The interleave-based fill limit, therefore, can be overridden via a control bit in a CSR within the CSR block 90 of FIG. 3. When this bit is set, the controller 14 performs two fills instead of the four that would otherwise be performed in a one-way interleaved configuration.

The second mode of optimization is the ability to dynamically change the number of appended fill read cycles depending on the activity on the system bus 11. If a fill transaction is already active on a memory module and a new transaction is initiated by the CPU that is not to the stream buffer being filled, then the control logic 45 will truncate the fill operation at the end of the current memory cycle although some location(s) within the stream buffer may not have been filled yet. This allows the new transaction to proceed without incurring the additional delays of completing the entire fill operation.

The third mode of operation is where the fill controller will align the address of the last location to be read with the last location available to do page mode reads to the DRAMS. In detail, the fill controller will avoid generating a fill operation that would cross an address boundary corresponding to the size of the maximum fill operation (e.g., four blocks if one-way interleaved). Instead, the fill controller will only perform fills that end at the appropriate address boundary for the given interleave mode. Then, when the next stream buffer fill operation is required to refill that stream buffer, the fill controller will perform a fill that starts on the appropriate address boundary and proceeds for the appropriate number of page mode read cycles before completing the fill operation. In this manner, the most efficient page mode read operations are used to refill the stream buffers when required.

Without these methods of optimization the stream buffers 51–54 could have a negative impact on system performance by delaying memory accesses received from the system bus 11 that miss the stream buffers until an ongoing fill is completed. This increase in latency causes the requesting CPU 10 to wait even longer for data to be returned and ties up the system bus 11 so that it is unavailable for other system elements.

The use of these optimization features significantly reduces the potential negative impact to the system performance by balancing the stream buffer maintenance with the resources required by other system elements. This results in faster completion of memory accesses and consequently and improvement of peak memory throughput.

Figure 12:
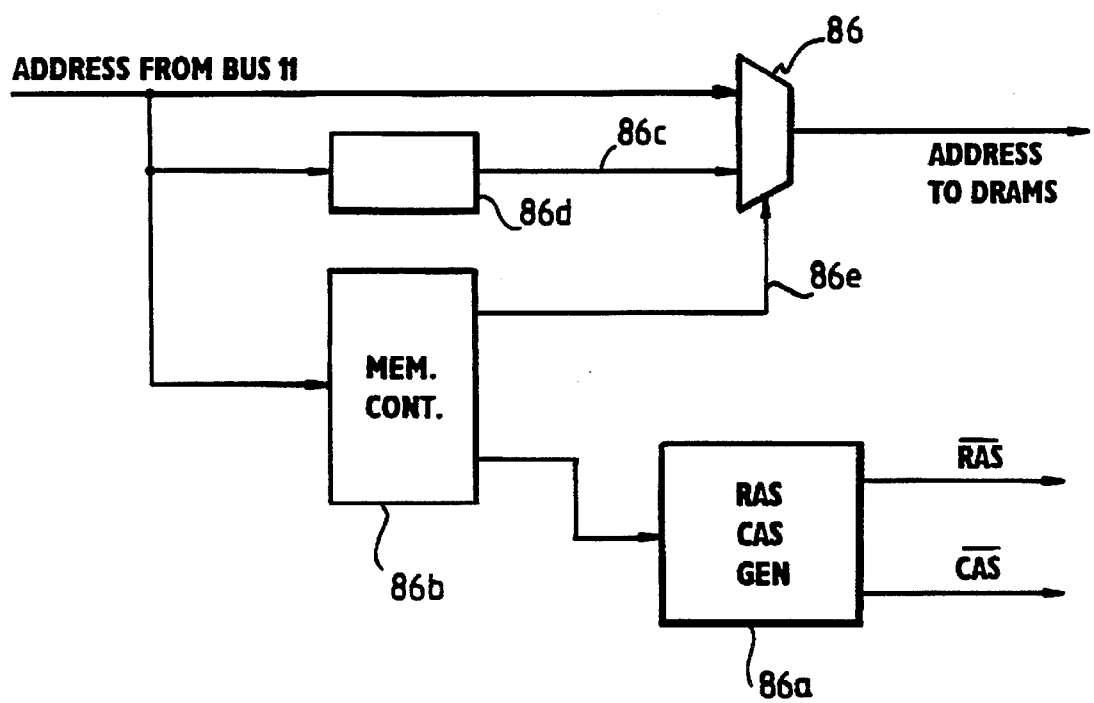
FIG. 12 is an electrical diagram in block form of the memory control for generating appended fill cycles, used in the controller of FIG. 3, according to one embodiment.

The appended fill operation used in one embodiment of the invention is initiated by a read transaction on the bus 11 to an address that does not match the addresses of existing prefetched data in the stream buffers 51–54, i.e., a miss in the stream buffer 15. The address of this read is checked to see if there is an opportunity to perform page mode read cycles. The page mode opportunity is defined as having sequential addresses available to do page mode cycles. Because the memory module supports exchange operations, a unique definition of the address bits is used as shown in Tables 1 and 2. Without this definition support for exchange operations and page mode DRAM operations are mutually exclusive. Referring to FIG. 12, the address from bus 11 for this read is applied to the DRAMs via multiplexer 86, and the read operation proceeds, accessing memory 12 using RAS and CAS generated by address strobe generator 86a, resulting in data being sent back to CPU in the usual manner for a read. If page mode read locations are available then the memory control 86b of FIG. 12 (part of controller 45 of FIG. 3) is notified and makes provisions to append page mode read operations to the end. That is, before RAS is brought high (deasserted), new column addresses will be sent to the memory via input 86c to the multiplexer 86, and the generator 86a will apply another CAS for each new column address. The address is incremented to the next location by logic 86d and provided to the DRAM address mux 86 where it is available when the normal read operation concludes. The controller 86b selects the normal address or the page mode append address by output 86e to the multiplexer.

Thus, when the normal read operation concludes, the controller 14 selects the appended page mode read address and blocks the negation of the RAS strobe to the DRAMS, thus keeping the DRAM active for accessing any column of the addressed row without a new RAS cycle. The CAS strobe is negated normally, but then after the appended page mode read access has been driven out to the DRAMs via multiplexer 86, the generator a reasserts CAS which reads the next sequential location which is selected by the appended page mode address. The address is then incremented to point to the next sequential location. This operation of providing an address and cycling CAS is repeated until all of the available page mode locations have been read.

The appended fill cycle operation functions to allow for the attaching of sequential memory access to the end of an existing memory access, thus prefetching memory data from the next sequential location. Because this access is appended to an existing DRAM read operation, the data from the next sequential location can he retrieved and stored in the stream buffer 15 before the current transaction on the bus 11 is completed. Thus the read latency is now a function of the bus protocol and not the DRAM read access time, allowing the bus 11 to run at its peak bandwidth. Without using this append operation, in order to read the sequential locations the controller 14 would have to initiate individual DRAM read operations for each location. If this were the case the sequence to read sequential locations would require that the DRAM operation terminate normally, wait for the minimum precharge time between DRAM accesses (as specified for the DRAM devices) then initiate a new DRAM read operation. In the time needed to perform two individual DRAM accesses, the appended read can perform four read accesses, since the page mode access time is much less than RAS-CAS access time, and the precharge part of the cycle time is not imposed for each page mode cycle.

Figure 13:
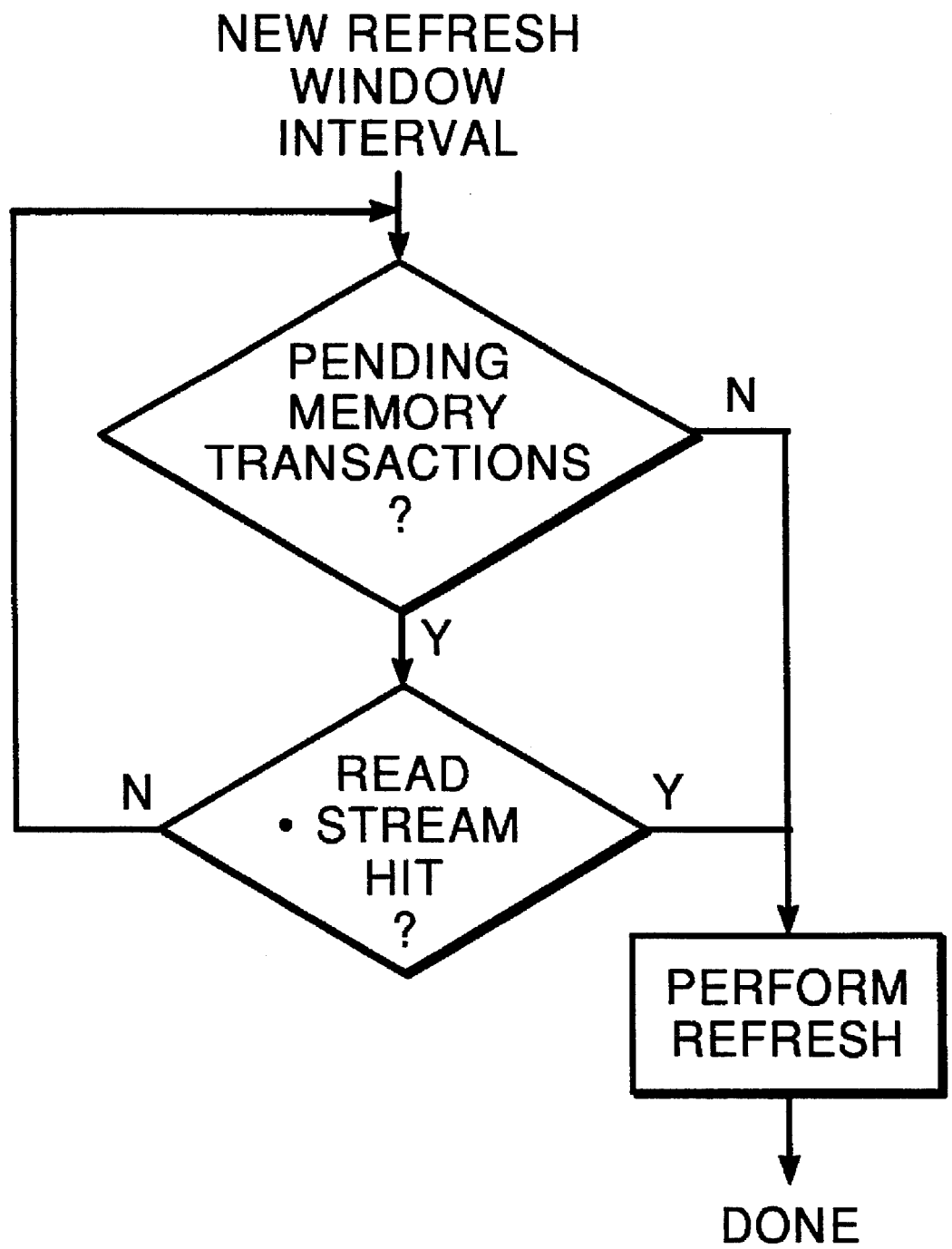
FIG. 13 is a flow chart showing one aspect of how memory refresh is carried out in the controller of FIG. 3.

As mentioned above, the controller 14 looks for opportunities during operation of the computer system of FIG. 1 to perform refresh of the DRAM array. One particular aspect of the refresh operation is shown in FIG. 13. A refresh window interval is a periodically-recurring interval during which the DRAMs must be refreshed; its duration and period are normally determined by the specifications of the particular DRAMs used. During each window interval, the controller 14 monitors the activity of the memory system to determine if there is an opportunity to perform refresh. If there are no pending memory transactions that are either using or need to use the DRAMs, then refresh is performed. In most cases, if there are pending memory transactions, refresh cannot be performed. However, if a pending read transaction that would otherwise access the DRAMs has hit in the stream buffer 15, then the DRAMs are free for refresh to occur. The taking of this additional refresh opportunity enhances memory performance by reducing the likelihood that a subsequent memory transaction is delayed because of refresh activity.

TABLE 1

Addressing Matrix For Modules Using 1MBit DRAMs

| LOGICAL SIGNAL | INTERLEAVE FACTOR WITH 2 BANKS | | | INTERLEAVE FACTOR WITH 4 BANKS | | |
|---|---|---|---|---|---|---|
| | 1-WAY | 2-WAY | 4-WAY | 1-WAY | 2-WAY | 4-WAY |
| ROW BIT 0 | CAD 5 | CAD 5 | CAD 5 | CAD 5 | CAD 5 | CAD 5 |
| ROW BIT 1 | CAD 6 | CAD 6 | CAD 6 | CAD 6 | CAD 6 | CAD 6 |
| ROW BIT 2 | CAD 7 | CAD 7 | CAD 7 | CAD 7 | CAD 7 | CAD 7 |
| ROW BIT 3 | CAD 8 | CAD 8 | CAD 8 | CAD 8 | CAD 8 | CAD 8 |
| ROW BIT 4 | CAD 9 | CAD 9 | CAD 9 | CAD 9 | CAD 9 | CAD 9 |
| ROW BIT 5 | CAD 10 | CAD 10 | CAD 10 | CAD 10 | CAD 10 | CAD 10 |
| ROW BIT 6 | CAD 11 | CAD 11 | CAD 11 | CAD 11 | CAD 11 | CAD 11 |
| ROW BIT 7 | CAD 12 | CAD 12 | CAD 12 | CAD 12 | CAD 12 | CAD 12 |
| ROW BIT 8 | CAD 13 | CAD 13 | CAD 13 | CAD 13 | CAD 13 | CAD 13 |
| ROW BIT 9 | N/A | N/A | N/A | N/A | N/A | N/A |
| RW COL BIT 0 | CAD 3 | CAD 22 | CAD 22 | CAD 3 | CAD 23 | CAD 23 |
| RW COL BIT 1 | CAD 4 | CAD 4 | CAD 23 | CAD 4 | CAD 4 | CAD 24 |
| RW COL BIT 2 | CAD 15 | CAD 15 | CAD 15 | CAD 15 | CAD 15 | CAD 15 |
| RW CCL BIT 3 | CAD 18 | CAD 18 | CAD 18 | CAD 18 | CAD 18 | CAD 18 |
| RW COL BIT 4 | CAD 19 | CAD 19 | CAD 19 | CAD 19 | CAD 19 | CAD 19 |
| RW COL BIT 5 | CAD 20 | CAD 20 | CAD 20 | CAD 20 | CAD 20 | CAD 20 |
| RW COL BIT 6 | CAD 21 | CAD 21 | CAD 21 | CAD 21 | CAD 21 | CAD 21 |

TABLE 1-continued

Addressing Matrix For Modules Using 1MBit DRAMs

| LOGICAL SIGNAL | INTERLEAVE FACTOR WITH 2 BANKS | | | INTERLEAVE FACTOR WITH 4 BANKS | | |
| --- | --- | --- | --- | --- | --- | --- |
| | 1-WAY | 2-WAY | 4-WAY | 1-WAY | 2-WAY | 4-WAY |
| RW COL BIT 7 | CAD 14 | CAD 14 | CAD 14 | CAD 14 | CAD 14 | CAD 14 |
| RW COL BIT 8 | CAD 17 | CAD 17 | CAD 17 | CAD 22 | CAD 22 | CAD 22 |
| RW COL BIT 9 | N/A | N/A | N/A | N/A | N/A | N/A |
| RW BANK SEL BIT 0 | CAD 16 | CAD 16 | CAD 16 | CAD 16 | CAD 16 | CAD 16 |
| RW BANK SEL BIT 1 | N/A | N/A | N/A | CAD 17 | CAD 17 | CAD 17 |
| RW BOARD SEL BIT 0 | CAD 22 | CAD 3 | CAD 3 | CAD 23 | CAD 3 | CAD 3 |
| RW BOARD SEL BIT 1 | CAD 23 | CAD 23 | CAD 4 | CAD 24 | CAD 24 | CAD 4 |
| RW BOARD SEL BIT 2 | CAD 24 | CAD 24 | CAD 24 | CAD 25 | CAD 25 | CAD 25 |
| RW BOARD SEL BIT 3 | CAD 25 | CAD 25 | CAD 25 | CAD 26 | CAD 26 | CAD 26 |
| RW BOARD SEL BIT 4 | CAD 26 | CAD 26 | CAD 26 | CAD 27 | CAD 27 | CAD 27 |
| RW BOARD SEL BIT 5 | CAD 27 | CAD 27 | CAD 27 | CAD 28 | CAD 28 | CAD 28 |
| RW BOARD SEL BIT 6 | CAD 28 | CAD 28 | CAD 28 | CAD 29 | CAD 29 | CAD 29 |
| RW BOARD SEL BIT 7 | CAD 29 | CAD 29 | CAD 29 | CAD 30 | CAD 30 | CAD 30 |
| RW BOARD SEL BIT 8 | CAD 30 | CAD 30 | CAD 30 | N/A | N/A | N/A |
| EX COL BIT 0 | CAD 3 | CAD 72 | CAD 72 | CAD 3 | CAD 73 | CAD 73 |
| EX COL BIT 1 | CAD 4 | CAD 4 | CAD 73 | CAD 4 | CAD 4 | CAD 74 |
| EX COL BIT 2 | CAD 15 | CAD 15 | CAD 15 | CAD 15 | CAD 15 | CAD 15 |
| EX COL BIT 3 | CAD 68 | CAD 68 | CAD 68 | CAD 68 | CAD 68 | CAD 68 |
| EX COL BIT 4 | CAD 69 | CAD 69 | CAD 69 | CAD 69 | CAD 69 | CAD 69 |
| EX COL BIT 5 | CAD 70 | CAD 70 | CAD 70 | CAD 70 | CAD 70 | CAD 70 |
| EX COL BIT 6 | CAD 71 | CAD 71 | CAD 71 | CAD 71 | CAD 71 | CAD 71 |
| EX COL BIT 7 | CAD 14 | CAD 14 | CAD 14 | CAD 14 | CAD 14 | CAD 14 |
| EX COL BIT 8 | CAD 67 | CAD 67 | CAD 67 | CAD 72 | CAD 72 | CAD 72 |
| EX COL BIT 9 | N/A | N/A | N/A | N/A | N/A | N/A |
| EX BANK SEL BIT 0 | CAD 66 | CAD 66 | CAD 66 | CAD 66 | CAD 66 | CAD 66 |
| EX BANK SEL BIT 1 | N/A | N/A | N/A | CAD 67 | CAD 67 | CAD 67 |
| EX BOARD SEL BIT 0 | CAD 72 | CAD 3 | CAD 3 | CAD 73 | CAD 3 | CAD 3 |
| EX BOARD SEL BIT 1 | CAD 73 | CAD 73 | CAD 4 | CAD 74 | CAD 74 | CAD 4 |
| EX BOARD SEL BIT 2 | CAD 74 | CAD 74 | CAD 74 | CAD 75 | CAD 75 | CAD 75 |
| EX BOARD SEL BIT 3 | CAD 75 | CAD 75 | CAD 75 | CAD 76 | CAD 76 | CAD 76 |
| EX BOARD SEL BIT 4 | CAD 76 | CAD 76 | CAD 76 | CAD 77 | CAD 77 | CAD 77 |
| EX BOARD SEL BIT 5 | CAD 77 | CAD 77 | CAD 77 | CAD 78 | CAD 78 | CAD 78 |
| EX BOARD SEL BIT 6 | CAD 78 | CAD 78 | CAD 78 | CAD 79 | CAD 79 | CAD 79 |
| EX BOARD SEL BIT 7 | CAD 79 | CAD 79 | CAD 79 | CAD 80 | CAD 80 | CAD 80 |
| EX BOARD SEL BIT 8 | CAD 80 | CAD 80 | CAD 80 | N/A | N/A | N/A |

TABLE 2

Addressing Matrix For Modules Using 4Mbit DRAMs

| LOGICAL SIGNAL | INTERLEAVE FACTOR WITH 2 BANKS | | | INTERLEAVE FACTOR WITH 4 BANKS | | |
| --- | --- | --- | --- | --- | --- | --- |
| | 1-WAY | 2-WAY | 4-WAY | 1-WAY | 2-WAY | 4-WAY |
| ROW BIT 0 | CAD 5 | CAD 5 | CAD 5 | CAD 5 | CAD 5 | CAD 5 |
| ROW BIT 1 | CAD 6 | CAD 6 | CAD 6 | CAD 6 | CAD 6 | CAD 6 |
| ROW BIT 2 | CAD 7 | CAD 7 | CAD 7 | CAD 7 | CAD 7 | CAD 7 |
| ROW BIT 3 | CAD 8 | CAD 8 | CAD 8 | CAD 8 | CAD 8 | CAD 8 |
| ROW BIT 4 | CAD 9 | CAD 9 | CAD 9 | CAD 9 | CAD 9 | CAD 9 |
| ROW BIT 5 | CAD 10 | CAD 10 | CAD 10 | CAD 10 | CAD 10 | CAD 10 |
| ROW BIT 6 | CAD 11 | CAD 11 | CAD 11 | CAD 11 | CAD 11 | CAD 11 |
| ROW BIT 7 | CAD 12 | CAD 12 | CAD 12 | CAD 12 | CAD 12 | CAD 12 |
| ROW BIT 8 | CAD 13 | CAD 13 | CAD 13 | CAD 13 | CAD 13 | CAD 13 |
| ROW BIT 9 | CAD 14 | CAD 14 | CAD 14 | CAD 14 | CAD 14 | CAD 14 |
| RW COL BIT 0 | CAD 3 | CAD 24 | CAD 24 | CAD 3 | CAD 25 | CAD 25 |
| RW COL BIT 1 | CAD 4 | CAD 4 | CAD 25 | CAD 4 | CAD 4 | CAD 26 |
| RW COL BIT 2 | CAD 15 | CAD 15 | CAD 15 | CAD 15 | CAD 15 | CAD 15 |
| RW COL BIT 3 | CAD 18 | CAD 18 | CAD 18 | CAD 18 | CAD 18 | CAD 18 |
| RW COL BIT 4 | CAD 19 | CAD 19 | CAD 19 | CAD 19 | CAD 19 | CAD 19 |
| RW COL BIT 5 | CAD 20 | CAD 20 | CAD 20 | CAD 20 | CAD 20 | CAD 20 |
| RW COL BIT 6 | CAD 21 | CAD 21 | CAD 21 | CAD 21 | CAD 21 | CAD 21 |
| RW COL BIT 7 | CAD 22 | CAD 22 | CAD 22 | CAD 22 | CAD 22 | CAD 22 |
| RW COL BIT 8 | CAD 17 | CAD 17 | CAD 17 | CAD 24 | CAD 24 | CAD 24 |
| RW COL BIT 9 | CAD 23 | CAD 23 | CAD 23 | CAD 23 | CAD 23 | CAD 23 |
| RW BANK SEL BIT 0 | CAD 16 | CAD 16 | CAD 16 | CAD 16 | CAD 16 | CAD 16 |
| RW BANK SEL BIT 1 | N/A | N/A | N/A | CAD 17 | CAD 17 | CAD 17 |
| RW BOARD SEL BIT 0 | CAD 24 | CAD 3 | CAD 3 | CAD 25 | CAD 3 | CAD 3 |
| RW BOARD SEL BIT 1 | CAD 25 | CAD 25 | CAD 4 | CAD 26 | CAD 26 | CAD 4 |
| RW BOARD SEL BIT 2 | CAD 26 | CAD 26 | CAD 26 | CAD 27 | CAD 27 | CAD 27 |

TABLE 2-continued

Addressing Matrix For Modules Using 4Mbit DRAMs

| LOGICAL SIGNAL | INTERLEAVE FACTOR WITH 2 BANKS | | | INTERLEAVE FACTOR WITH 4 BANKS | | |
|---|---|---|---|---|---|---|
| | 1-WAY | 2-WAY | 4-WAY | 1-WAY | 2-WAY | 4-WAY |
| RW BOARD SEL BIT 3 | CAD 27 | CAD 27 | CAD 27 | CAD 28 | CAD 28 | CAD 28 |
| RW BOARD SEL BIT 4 | CAD 28 | CAD 28 | CAD 28 | CAD 29 | CAD 29 | CAD 29 |
| RW BOARD SEL BIT 5 | CAD 29 | CAD 29 | CAD 29 | CAD 30 | CAD 30 | CAD 30 |
| RW BOARD SEL BIT 6 | CAD 30 | CAD 30 | CAD 30 | N/A | N/A | N/A |
| RW BOARD SEL BIT 7 | N/A | N/A | N/A | N/A | N/A | N/A |
| RW BOARD SEL BIT 8 | N/A | N/A | N/A | N/A | N/A | N/A |
| EX COL BIT 0 | CAD 3 | CAD 74 | CAD 74 | CAD 3 | CAD 75 | CAD 75 |
| EX COL BIT 1 | CAD 4 | CAD 4 | CAD 75 | CAD 4 | CAD 4 | CAD 76 |
| EX COL BIT 2 | CAD 15 | CAD 15 | CAD 15 | CAD 15 | CAD 15 | CAD 15 |
| EX COL BIT 3 | CAD 68 | CAD 68 | CAD 68 | CAD 68 | CAD 68 | CAD 68 |
| EX COL BIT 4 | CAD 69 | CAD 69 | CAD 69 | CAD 69 | CAD 69 | CAD 69 |
| EX COL BIT 5 | CAD 70 | CAD 70 | CAD 70 | CAD 70 | CAD 70 | CAD 70 |
| EX COL BIT 6 | CAD 71 | CAD 71 | CAD 71 | CAD 71 | CAD 71 | CAD 71 |
| EX COL BIT 7 | CAD 72 | CAD 72 | CAD 72 | CAD 72 | CAD 72 | CAD 72 |
| EX COL BIT 8 | CAD 67 | CAD 67 | CAD 67 | CAD 74 | CAD 74 | CAD 74 |
| EX COL BIT 9 | CAD 73 | CAD 73 | CAD 73 | CAD 73 | CAD 73 | CAD 73 |
| EX BANK SEL BIT 0 | CAD 66 | CAD 66 | CAD 66 | CAD 66 | CAD 66 | CAD 66 |
| EX BANK SEL BIT 1 | N/A | N/A | N/A | CAD 67 | CAD 67 | CAD 67 |
| EX BOARD SEL BIT 0 | CAD 74 | CAD 3 | CAD 3 | CAD 75 | CAD 3 | CAD 3 |
| EX BOARD SEL BIT 1 | CAD 75 | CAD 75 | CAD 4 | CAD 76 | CAD 76 | CAD 4 |
| EX BOARD SEL BIT 2 | CAD 76 | CAD 76 | CAD 76 | CAD 77 | CAD 77 | CAD 77 |
| EX BOARD SEL BIT 3 | CAD 77 | CAD 77 | CAD 77 | CAD 78 | CAD 78 | CAD 78 |
| EX BOARD SEL BIT 4 | CAD 78 | CAD 78 | CAD 78 | CAD 79 | CAD 79 | CAD 79 |
| EX BOARD SEL BIT 5 | CAD 79 | CAD 79 | CAD 79 | CAD 80 | CAD 80 | CAD 80 |
| EX BOARD SEL BIT 6 | CAD 80 | CAD 80 | CAD 80 | N/A | N/A | N/A |
| EX BOARD SEL BIT 7 | N/A | N/A | N/A | N/A | N/A | N/A |
| EX BOARD SEL BIT 8 | N/A | N/A | N/A | N/A | N/A | N/A |

What is claimed is:

1. Apparatus, comprising:

a memory array having an output port coupled to a memory array bus;

a first latch whose data input is coupled to said memory array bus;

a second latch whose data input is coupled to said memory array bus;

a data storage buffer having an input port and an output port, the input port being coupled to the data output of said second latch;

means for selectively coupling the data output of said first latch and the output port of said data storage buffer to a system bus over which data from said first latch and said data storage buffer is to be transferred;

means for enabling said first latch to be loaded from said memory array with data to be subsequently transferred over said system bus;

means for disabling said first latch from being loaded from said memory array when said first latch contains data to be transferred over said system bus and said system bus is unavailable for the transfer of the data contained in said first latch; and means for enabling said second latch to be loaded from said memory array with data to be subsequently stored in said data storage buffer while said first latch is disabled from being loaded from said memory array is disabled.

2. Apparatus according to claim 1, wherein said coupling means comprises:

a multiplexer having a select input upon which a select signal is to be received, a first data input coupled to the data output of said first latch, a second data input coupled to the output port of said data storage buffer, and a data output coupled to said system bus; and means for generating said select signal in a manner effective to enable the transfer of data from said first data latch and said data storage buffer over said system bus.

3. Apparatus for use in conjunction with a memory module in a memory system, comprising:

means for storing a control bit denoted a fill limit indicator; and means for prefetching blocks of data in a manner dependent upon the state of said fill limit indicator, the number of blocks of data that are prefetched while said fill limit indicator is not set being one less than $I_{max}/I_{actual}$, where $I_{max}$ is a maximum degree to which said memory module can be interleaved with other memory modules in said memory system, and $I_{actual}$ is an actual degree of such interleaving, and the number of blocks of data that are prefetched while said fill limit indicator is set being the lesser of (a) the number of data blocks that would be prefetched if said fill limit indicator were not set, and (b) a predetermined number that is substantially less than said maximum degree of interleaving.

4. Apparatus according to claim 3, wherein said maximum degree of interleaving is four, and wherein said predetermined number is 1.

5. Apparatus according to claim 4, wherein the size of each fetched data block is 32 bytes.

6. Apparatus, comprising:

means for receiving read commands from a processor, each read command specifying a corresponding memory location to be read;

a history buffer for storing address values each corresponding to the address of the memory location specified by a corresponding one of said read commands;

means for determining for each of said read commands whether a predetermined relationship exists between the address of the memory location specified thereby and any of the address values stored in said history buffer;

means for prefetching data from a memory at memory locations each sequentially following the memory location specified by a corresponding read command for which said predetermined relationship is determined to exist;

means for storing the prefetched data into a stream buffer;

means for determining for each of said read commands whether the data from the memory location specified thereby is stored in said stream buffer;

means for fetching from said stream buffer the data that is determined to be stored in said stream buffer;

means for returning the data fetched from said stream buffer to said processor; and means for refraining from storing into said history buffer an address value corresponding to the address of the memory location specified by each of said read commands for which the data from the memory location specified thereby is determined to be stored in said stream buffer.

7. Apparatus, comprising:

1) means for monitoring operation of a memory system to determine whether the following conditions exist:
   a) a pending memory read transaction that would otherwise require access to a memory array in said memory system has hit in a stream buffer in said memory system so that data requested thereby can be obtained from said stream buffer rather than said memory array;
   b) refresh of said memory array has not yet been performed during a refresh window interval; and
   c) there are no additional pending memory transactions either using or requiring the use of said memory array; and 2) means for refreshing said memory array upon the simultaneous existence of all of the foregoing conditions.

8. Apparatus, comprising:

a latch coupled to a bus to receive an address therefrom;

a first decoder coupled to said latch and configured to assert a first select signal on an output thereof when said latch contains a first predetermined address value;

a second decoder coupled to said latch and configured to assert a second select signal on an output thereof when said second decoder is enabled and said latch contains a second predetermined address value different from said first predetermined address value;

means for indicating whether either of said first and second select signals is asserted; and means coupled to said bus and to said second decoder for enabling and disabling said second decoder in response to a corresponding command received from said bus.

* * * * *